(12) United States Patent
Okamoto et al.

(10) Patent No.: US 12,154,904 B2
(45) Date of Patent: Nov. 26, 2024

(54) SEMICONDUCTOR DEVICE

(71) Applicant: Socionext Inc., Kanagawa (JP)

(72) Inventors: Atsushi Okamoto, Yokohama (JP); Wenzhen Wang, Yokohama (JP); Hirotaka Takeno, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 426 days.

(21) Appl. No.: 17/714,683

(22) Filed: Apr. 6, 2022

(65) Prior Publication Data
US 2022/0231054 A1    Jul. 21, 2022

Related U.S. Application Data

(63) Continuation of application No. PCT/JP2019/040259, filed on Oct. 11, 2019.

(51) Int. Cl.
*H01L 27/118* (2006.01)

(52) U.S. Cl.
CPC ........... *H01L 27/11807* (2013.01); *H01L 2027/11881* (2013.01); *H01L 2027/11892* (2013.01)

(58) Field of Classification Search
CPC ................................................. H01L 27/11807
See application file for complete search history.

(56) References Cited

U.S. PATENT DOCUMENTS

| | | | |
|---|---|---|---|
| 8,530,273 B2 | 9/2013 | Den Boer | |
| 9,754,923 B1 | 9/2017 | Xie et al. | |
| 10,950,546 B1 | 3/2021 | Doornbos | |
| 11,004,789 B2 | 5/2021 | Doornbos et al. | |
| 11,637,067 B2 * | 4/2023 | Doornbos | ......... H01L 21/76898 |
| | | | 257/206 |
| 2013/0300462 A1 | 11/2013 | Koyama et al. | |
| 2015/0162448 A1 | 6/2015 | Raghavan et al. | |
| 2015/0187642 A1 | 7/2015 | Batra et al. | |
| 2018/0145030 A1 | 5/2018 | Beyne et al. | |

FOREIGN PATENT DOCUMENTS

| | | |
|---|---|---|
| JP | S53-026689 A | 3/1978 |
| JP | H05-206420 A | 8/1993 |
| JP | H11-102910 A | 4/1999 |
| JP | 2009-302198 A | 12/2009 |
| JP | 2012-044042 A | 3/2012 |
| JP | 2014-165358 A | 9/2014 |
| JP | 2018-107463 A | 7/2018 |

OTHER PUBLICATIONS

International Search Report dated Nov. 19, 2019 issued in International Patent Application No. PCT/JP2019/040259, with English translation.

* cited by examiner

*Primary Examiner* — Douglas M Menz
(74) *Attorney, Agent, or Firm* — Rimon P.C.

(57) ABSTRACT

A semiconductor device includes a first chip including a substrate and a first interconnection layer formed on a first surface of the substrate; and a second interconnection layer formed on a second surface opposite to the first surface of the substrate. The second interconnection layer includes a first power line to which a first power potential is applied, a second power line to which a second power potential is applied, and a first switch connected between the first power line and the second power line. The first chip includes a first grounding line, a third power line to which the second power potential is applied, and a first region in which the first grounding line and the third power line are disposed. In plan view, the first switch overlaps the first region.

17 Claims, 36 Drawing Sheets

SEMICONDUCTOR DEVICE

CROSS-REFERENCE TO RELATED APPLICATION

The present application is a continuation of international application No. PCT/JP2019/040259, filed on Oct. 11, 2019, and designated the U.S., the entire contents of which are incorporated herein by reference.

BACKGROUND OF THE INVENTION

1. Field of the Invention

The present invention relates to a semiconductor device.

2. Description of the Related Art

A semiconductor device includes various circuit regions, one example of which is a standard cell region. The standard cell region includes various logic circuits and a power switch circuit.

The power switch circuit, which is provided between, for example, a power line that supplies a VDD power potential to the semiconductor device and a power line that supplies a VVDD power potential to a transistor of the logic circuit, switches between states of supplying and not supplying the power potential VVDD to the transistor. By using the power switch circuit, the power supply is turned off when there is no need to operate the logic circuit, and the leakage current generated in the transistor included in the logic circuit is reduced, thereby reducing the power consumption.

A technique has been proposed in which a secondary semiconductor chip that includes an interconnection is attached to the back side of a main semiconductor chip and a power potential is supplied to a transistor of the main semiconductor chip via the interconnection of the secondary semiconductor chip. Such a technique is sometimes called a backside-power delivery network (BS-PDN).

PRIOR ART DOCUMENTS

Patent Documents

[Patent Document 1] U.S. Patent Application Publication No. 2015/0162448
[Patent Document 2] U.S. Pat. No. 9,754,923
[Patent Document 3] U.S. Patent Application Publication No. 2018/0145030
[Patent Document 4] U.S. Pat. No. 8,530,273
[Patent Document 5] Japanese Patent No. 6469269

SUMMARY

In one aspect of the disclosed art, a semiconductor device includes a first chip including a substrate and a first interconnection layer formed on a first surface of the substrate; and a second interconnection layer formed on a second surface opposite to the first surface of the substrate. The second interconnection layer includes a first power line to which a first power potential is applied, a second power line to which a second power potential is applied, and a first switch connected between the first power line and the second power line. The first chip includes a first grounding line, a third power line to which the second power potential is applied, and a first region in which the first grounding line and the third power line are disposed. In plan view, the first switch overlaps the first region.

The object and advantages of the invention will be implemented and attained by the elements and combinations particularly pointed out in the appended claims.

It is to be understood that both the foregoing general description and the following detailed description are exemplary and explanatory and are not restrictive of the invention as claimed.

BRIEF DESCRIPTION OF DRAWINGS

Other objects and further features of embodiments will become apparent from the following detailed description when read in conjunction with the accompanying drawings, in which.

DESCRIPTION OF EMBODIMENTS

Figure 1:
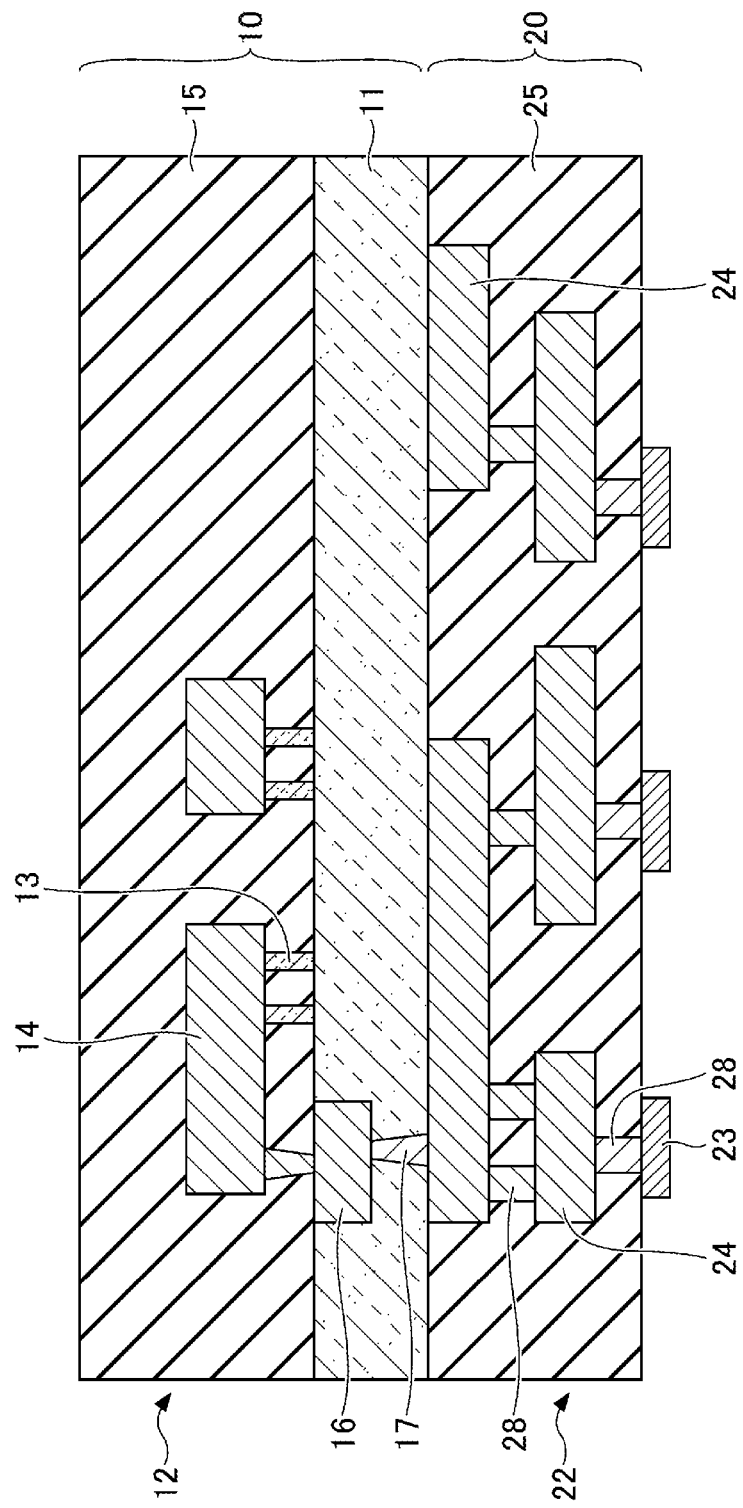
FIG. 1 is a cross-sectional diagram depicting an outline of a semiconductor device according to a first embodiment.

Concerning the related art described above, so far, no detailed consideration has been made of the specific configuration of providing a power switch circuit in such a secondary semiconductor chip that includes an interconnection.

It is an object of embodiments of the present invention to provide a semiconductor device capable of appropriately providing a power switch circuit.

In accordance with the embodiments, a power switch circuit can be provided appropriately.

Hereinafter, the embodiments will be described in detail with reference to the accompanying drawings. In the present specification and the drawings, for components having substantially the same functional structures, duplicate descriptions may be omitted by providing the same reference numerals. In the following description, two directions parallel to the surface of the substrate and perpendicular to each other are referred to as a X-direction and a Y-direction; and the direction perpendicular to the surface of the substrate is referred to as a Z-direction. Moreover, the expression that layouts are the same as each other in the present disclosure does not strictly mean that any layout difference occurring due to manufacturing variation is not allowed, and even if any layout difference occurs due to manufacturing variation, it can be regarded as layouts being the same as each other.

First Embodiment

A first embodiment will now be described. FIG. 1 is a cross-sectional diagram depicting an outline of a semiconductor device according to the first embodiment. As depicted in FIG. 1, the semiconductor device according to the first embodiment includes a first chip 10 and a second chip 20.

The first chip 10 is, for example, a semiconductor chip and includes a substrate 11 and a first interconnection layer 12. The substrate 11 is, for example, a silicon substrate, and a semiconductor element, such as a transistor, is formed on the front side of the substrate 11. The transistor is a FinFET including, for example, fins 13 in a source, a drain and a channel. The first interconnection layer 12 is formed on the front side of the substrate 11 and includes an interconnection 14 and an insulating layer 15. Portions of the interconnection 14 are connected to the fins 13. In addition, on the front side of the substrate 11, for example, a power line 16 connected to the interconnection 14 is formed, and a via 17 is provided in the substrate 11 from the power line 16 to reach the back side of the substrate 11. The via 17 is, for example, a silicon-penetrating via (through-silicon via: TSV). As depicted in FIG. 1, a portion of the interconnection 14 may have a via-like configuration and be connected to the power line 16.

The second chip 20 is, for example, a semiconductor chip and is positioned to face the back side of the substrate 11 of the first chip 10. The second chip 20 includes, for example, a second interconnection layer 22 and pads 23. The second interconnection layer 22 includes interconnections 24 and an insulating layer 25. The top surface of the second interconnection layer 22 faces the back surface of the substrate 11 of the first chip 10, for example. That is, the substrate 11 is positioned between the first interconnection layer 12 and the second interconnection layer 22. The second interconnection layer 22 may include a plurality of interconnections 24, as depicted in FIG. 1. The plurality of interconnections 24 may be connected via vias 28 provided in the second interconnection layer 22. The pads 23 are external connection terminals connected to, for example, an interconnection substrate or board. A portion of the interconnections 24 is connected to a via 17. The pads 23 are provided on the back side of the second interconnection layer 22 and are connected to the interconnections 24 through vias 28. The second interconnection layer 22 is supplied with a power potential and a signal is transmitted through the pad 23.

The second chip 20 may be as large as the first chip 10 or larger than the first chip 10. The pads 23 may be provided outside of the first chip 10 in plan view on the face of the second chip 20 opposite to the first chip 10. Hereinafter, plan view of the front side of the first chip 10 is referred to as a plan view.

The second interconnection layer 22 may be provided by forming the interconnections 24 and the insulating layer 25 and the like on the back side of the substrate 11. The second interconnection layer 22 may be formed on a second substrate on which a TSV is formed and the pad 23 may be provided on the back side of the second substrate.

Note that the cross-sectional diagram depicted in FIG. 1 depicts an outline of the semiconductor device, and the details thereof will be depicted with reference to FIGS. 9 to 13.

Figure 2:
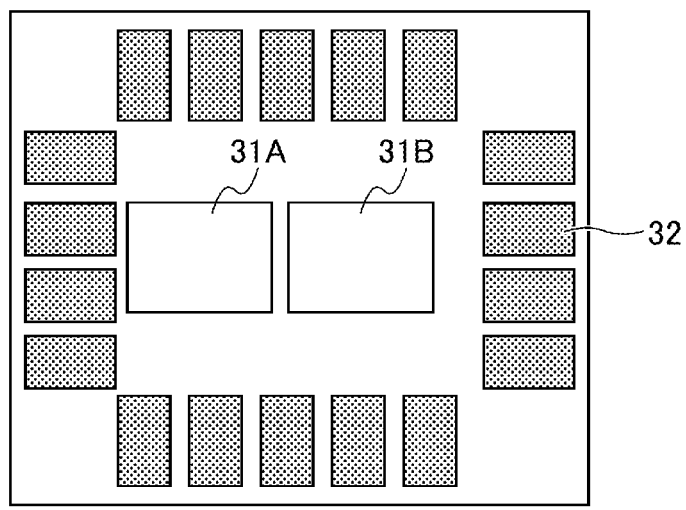
FIG. 2 is a diagram depicting a layout in a first chip in the first embodiment.

Next, the layout in the first chip 10 will be described. FIG. 2 is a diagram depicting a layout in the first chip 10.

As depicted in FIG. 2, the first chip 10 includes a first power domain 31A, a second power domain 31B, and input and output (I/O) cell regions 32. The I/O cell regions 32 are disposed, for example, around the first power domain 31A and the second power domain 31B. The number of first power domains 31A and the number of second power domains 31B may be two or more.

Figure 3:
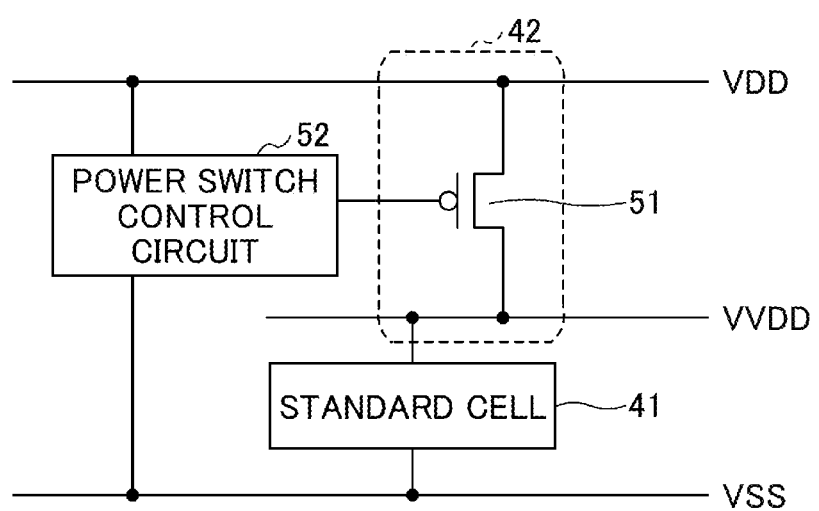
FIG. 3 is a circuit diagram depicting a configuration of a circuit included in the semiconductor device according to the first embodiment.

Next, the circuit included in the semiconductor device according to the first embodiment will be described. FIG. 3 is a circuit diagram depicting a configuration of the circuit included in the semiconductor device according to the first embodiment.

As depicted in FIG. 3, the semiconductor device according to the first embodiment includes a standard cell 41, a power switch circuit 42, and a power switch control circuit 52. The power switch control circuit 52 is provided in the first power domain 31A of the first chip 10. The standard cell 41 is provided in the second power domain 31B of the first chip 10. The standard cell 41 includes various logic circuits, such as NAND circuits, inverters, and the like. The power switch control circuit 52 includes a buffer as will be described later. In the first power domain 31A, there is a VSS interconnection for supplying the ground potential to the power switch control circuit 52 and a VDD interconnection for supplying a power potential. The second power domain 31B has a VSS interconnection for supplying the ground potential to the standard cell 41 and a VVDD interconnection for supplying a power potential.

The power switch circuit 42 is provided in the second chip 20, as will be described in detail later. The power switch circuit 42 includes a switch transistor 51. The switch transistor 51 is a p-channel MOS transistor, for example, connected between a VDD interconnection and a VVDD interconnection. The power switch control circuit 52 is connected to the gate of the switch transistor 51 to control the operation of the switch transistor 51. The power switch control circuit 52 switches the state of the switch transistor 51 between the turned on state and the turned off state and controls the conduction between the VDD interconnection and the VVDD interconnection. The power switch control circuit 52 includes, for example, a buffer. The switch transistor 51 may be a thin film transistor (TFT) or may be a micro electro mechanical systems (MEMS) switch. There may be a VSS interconnection that supplies the ground potential to the first power domain 31A and a VVSS interconnection that supplies the ground potential to the second power domain 31B, and an n-channel MOS transistor as the switch transistor 51 may be provided between the VSS interconnection and the VVSS interconnection.

Figure 4:
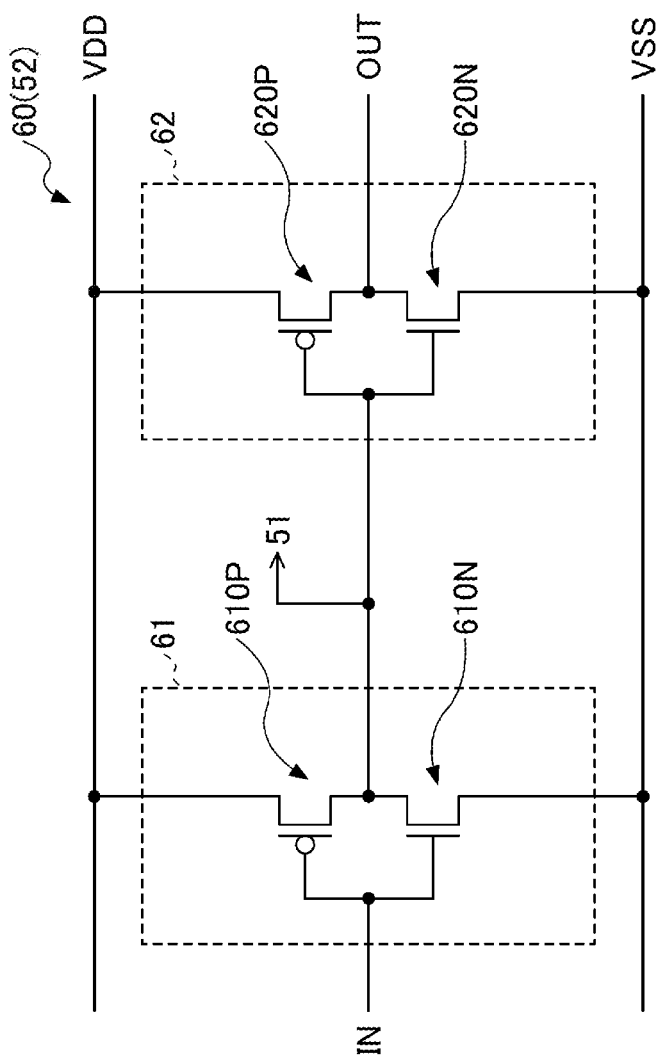
FIG. 4 is a circuit diagram depicting a configuration of a buffer.
Figure 5:
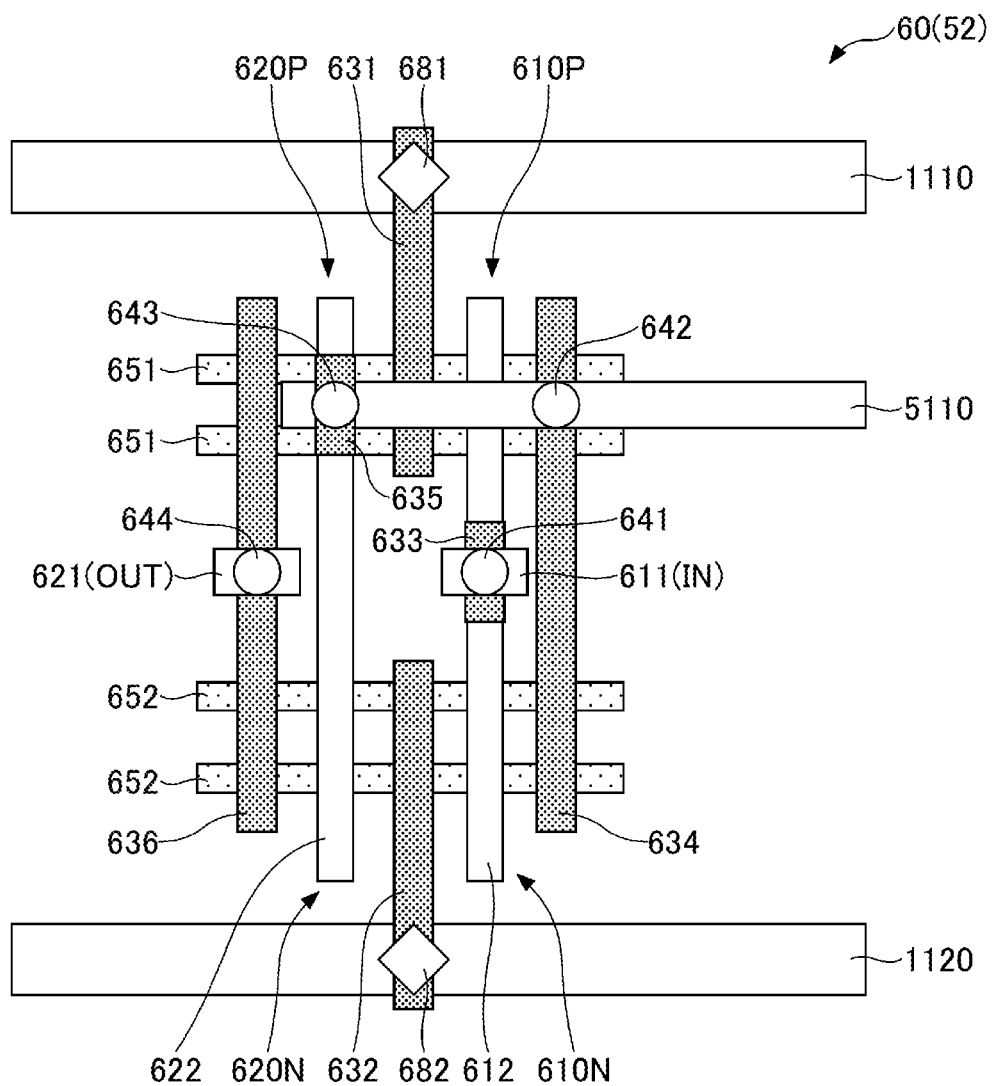
FIG. 5 is a schematic diagram depicting a configuration of the buffer in plan view.

Next, the configuration of the buffer included in the power switch control circuit 52 will be described. FIG. 4 is a circuit diagram depicting a buffer configuration. FIG. 5 is a schematic diagram depicting a configuration of the buffer in plan view.

As depicted in FIG. 4, the buffer 60 contained in the power switch control circuit 52 includes an inverter 61 and an inverter 62. An input signal IN is input to the inverter 61, an output of the inverter 61 is input to the gate of the switch transistor 51 and the inverter 62, and an output signal OUT is output from the inverter 62. The inverter 61 includes a p-channel MOS transistor 610P and an n-channel MOS transistor 610N. The inverter 62 includes a p-channel MOS transistor 620P and an n-channel MOS transistor 620N.

For example, as depicted in FIG. 5, a power line 1110 corresponding to a VDD interconnection and a power line 1120 corresponding to a VSS interconnection are provided. The power lines 1110 and 1120 extend in the X-direction. Semiconductor fins 651 extending in the X-direction are provided on the power line 1120 side of the power line 1110. The two fins 651 are provided, for example. Semiconductor fins 652 extending in the X-direction are provided on the power line 1120 side of the fins 651. The two fins 652 are provided, for example. A local interconnection 631 is provided which extends in the Y-direction and is connected to the fins 651 and is connected to the power line 1110 via a via 681. A local interconnection 632 is provided that extends in the Y-direction and is connected to the fin 652 and is connected to the power line 1120 via a via 682. A local interconnection 634 is provided in the X-direction of the local interconnections 631 and 632 to be connected to the fins 651 and 652. A local interconnection 636 is provided in the direction opposite to the X-direction of the local interconnections 631 and 632 and is connected to the fins 651 and 652.

A gate electrode 612 is provided intersecting via a gate insulating film (not depicted) the fins 651 and 652 between the local interconnection 631 and the local interconnection 634 and between the local interconnection 632 and the local interconnection 634. A gate electrode 622 is provided intersecting via a gate insulating film (not depicted) the fins 651 and 652 between the local interconnection 631 and the local interconnection 636 and between the local interconnection 632 and the local interconnection 636. The gate electrode 612 is connected to an interconnection 611 via a local interconnection 633 and a via 641. The gate electrode 622 is connected to a control signal line 5110 via a local interconnection 635 and a via 643. The control signal line 5110 is also connected to a local interconnection 634 via a via 642. The local interconnection 636 is connected to an interconnection 621 via a via 644. An input signal IN is input to the interconnection 611 and an output signal OUT is output from the interconnection 621 (see FIG. 4). The control signal line 5110 is connected to the gate of the switch transistor 51. That is, the control signal line 5110 functions as a signal line to transmit a control signal with respect to the switch transistor 51.

Note that the configurations of the inverters 61 and 62 are exemplary. For example, the number of pairs of the p-channel MOS transistors and the n-channel MOS transistors included in each of the inverters 61 and 62 may be two or more. The interconnection connected to the gate of the switch transistor 51 may also be connected to the input or output of the buffer 60.

Figure 6:
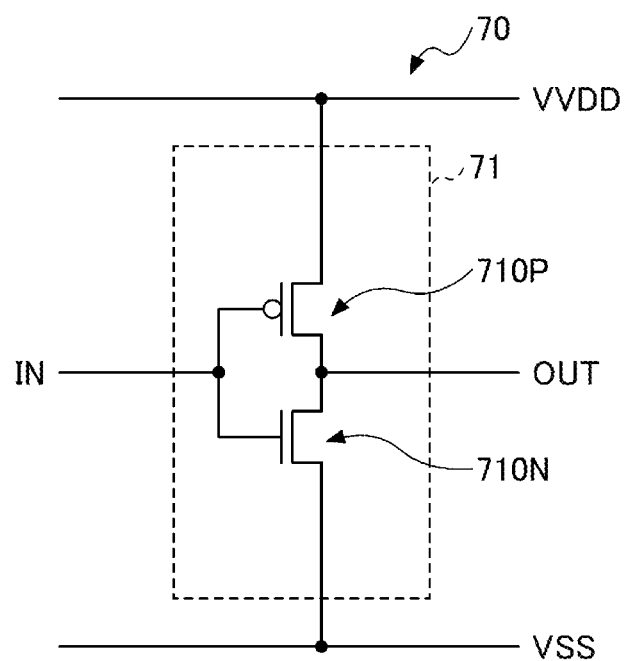
FIG. 6 is a circuit diagram depicting a configuration of an inverter.
Figure 7:
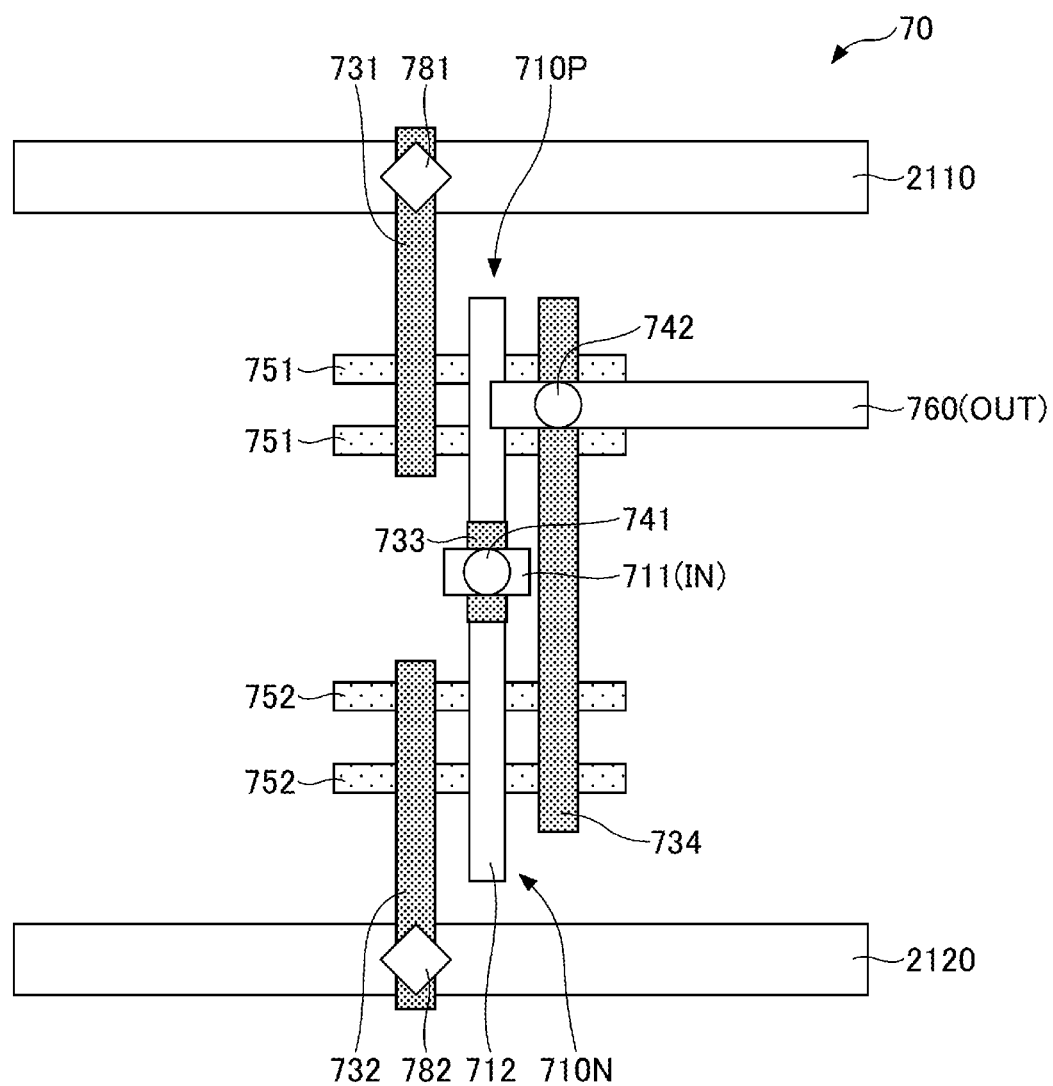
FIG. 7 is a schematic view depicting a configuration of the inverter in plan view.

Next, the configuration of an inverter as an example of the circuit included in the standard cell 41 will be described. FIG. 6 is a circuit diagram depicting the inverter configuration. FIG. 7 is a schematic view depicting a configuration of the inverter in plan view.

As depicted in FIG. 6, the inverter 70 includes a p-channel MOS transistor 710P and an re-channel MOS transistor 710N.

For example, as depicted in FIG. 7, a power line 2110 corresponding to a VVDD interconnection and a power line 2120 corresponding to a VSS interconnection are provided. The power lines 2110 and 2120 extend in the X-direction. Semiconductor fins 751 extending in the X-direction are provided on the power line 2120 side of the power line 2110. The two fins 751 are provided, for example. Semiconductor fins 752 extending in the X-direction are provided on the power line 2120 side of the fins 751. The two fins 752 are provided, for example. A local interconnection 731 is provided that extends in the Y-direction, is connected to the fins 751, and is connected to the power line 2110 via a via 781. A local interconnection 732 is provided that extends in the Y-direction, is connected to the fins 752, and is connected to the power line 2120 via a via 782. A local interconnection 734 is provided in the X-direction with respect to the local interconnections 731 and 732 and is connected to the fins 751 and 752.

A gate electrode 712 is provided intersecting the fins 751 and 752 via a gate insulating layer (not depicted) between the local interconnection 731 and the local interconnection 734 and between the local interconnection 732 and the local interconnection 734. The gate electrode 712 is connected to an interconnection 711 via a local interconnection 733 and a via 741. The local interconnection 734 is connected to an interconnection 760 via a via 742. An input signal IN is input to the interconnection 711 and an output signal OUT is output from the interconnection 760 (see FIG. 6).

Note that the circuit included in the standard cell 41 is not limited to an inverter, and may include a circuit such as any one or any ones of various logic circuits. The circuit included in the standard cell 41 may include a static random access memory (SRAM) cell. The circuit may be provided throughout a region that includes three or more power lines 2110 and 2120. That is, a so-called multi-height circuit may be included.

FIGS. 5 and 7 depict the transistors using fins (FinFETs), but the first and second power domains 31A and 31B may be provided with planar transistors, complementary field effect transistors (CFETs), transistors using nanowires, or the like.

Figure 8:
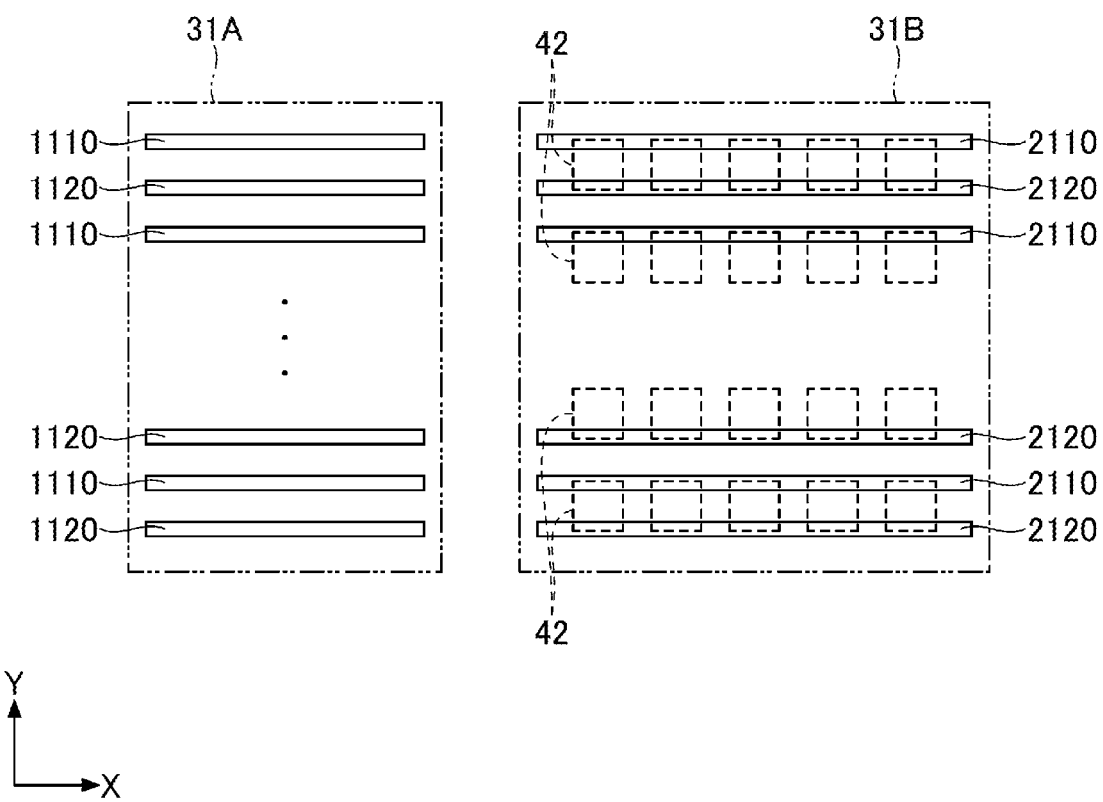
FIG. 8 is a schematic diagram depicting an outline of power domains in the first embodiment.

An outline of the first power domain 31A and the second power domain 31B will now be described. FIG. 8 is a schematic diagram depicting an outline of power domains in the first embodiment.

As depicted in FIG. 8, for example, the second power domain 31B is positioned in the X-direction with respect to the first power domain 31A. The first power domain 31A includes circuits connected to power lines 1110 and 1120. For example, the buffer 60 of the power switch control circuit 52 depicted in FIGS. 4 and 5 is included in the first power domain 31A. The second power domain 31B includes circuits connected to power lines 2110 and 2120. For example, the inverter 70 depicted in FIGS. 6 and 7 is included in the second power domain 31B. In plan view of the front side of the first chip 10, the power switch circuits 42 overlap the second power domain 31B. Note that, at least a portion of the first power domain 31A and the second power domain 31B may be arranged along an extending direction of the power line 1110 and the power line 2110, as depicted in FIG. 8, when the second power domain 31B is disposed around the first power domain 31A for example.

Figure 9:
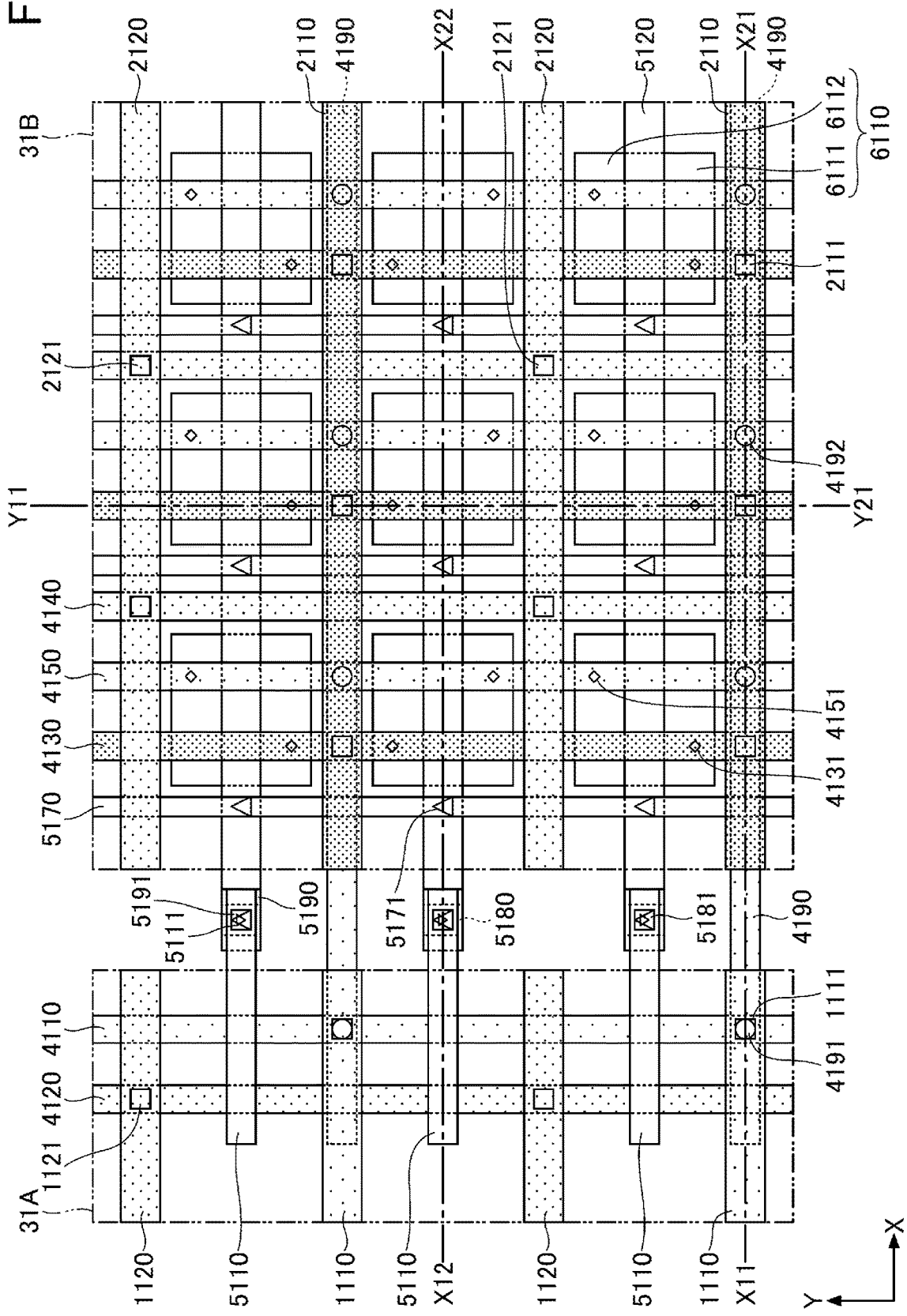
FIG. 9 is a schematic diagram depicting a configuration of a semiconductor device in plan view according to the first embodiment.
Figure 10:
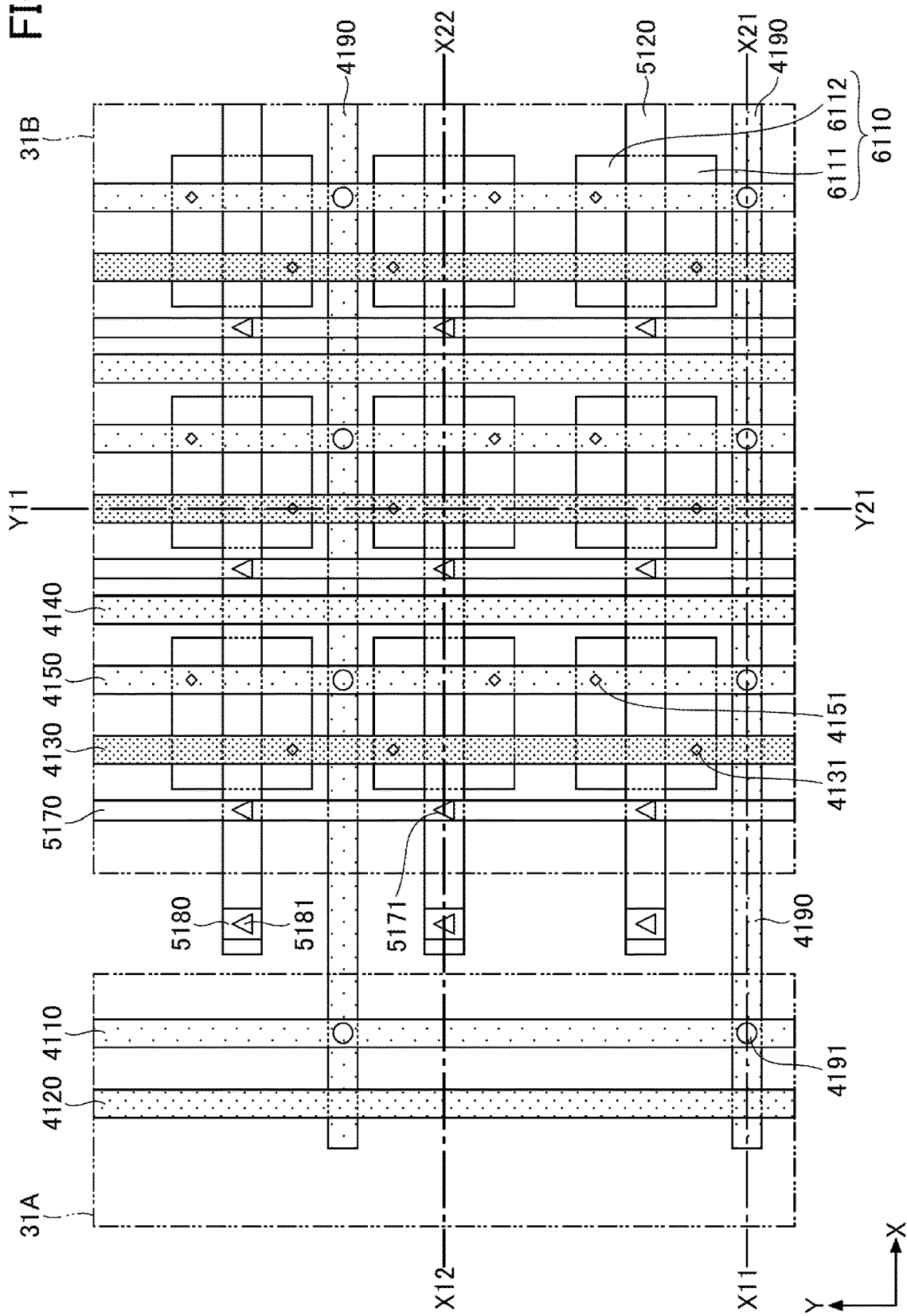
FIG. 10 is a schematic diagram depicting a configuration of the semiconductor device according to the first embodiment in plan view.
Figure 11:
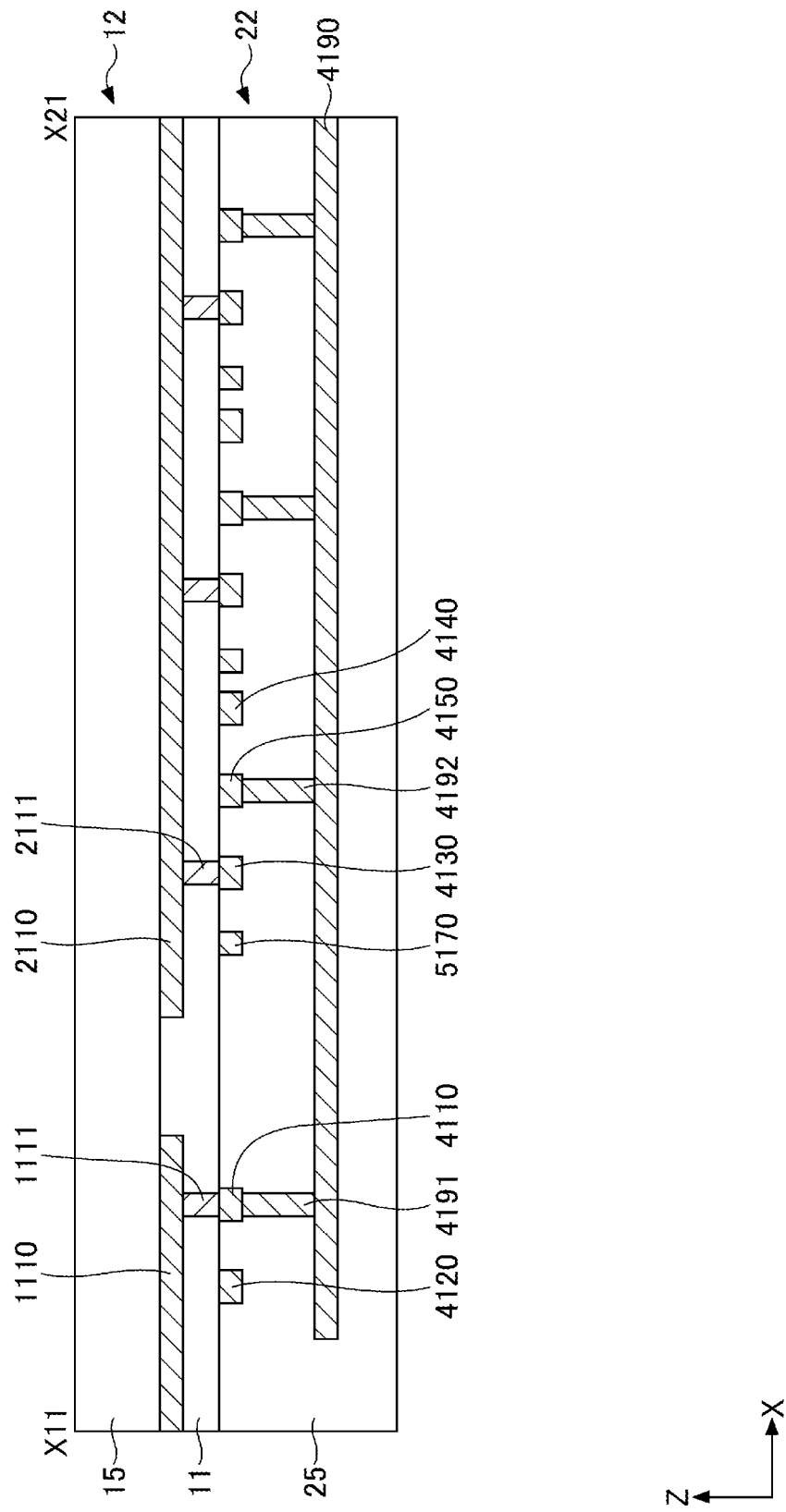
FIG. 11 is a cross-sectional diagram depicting the semiconductor device according to the first embodiment.
Figure 12:
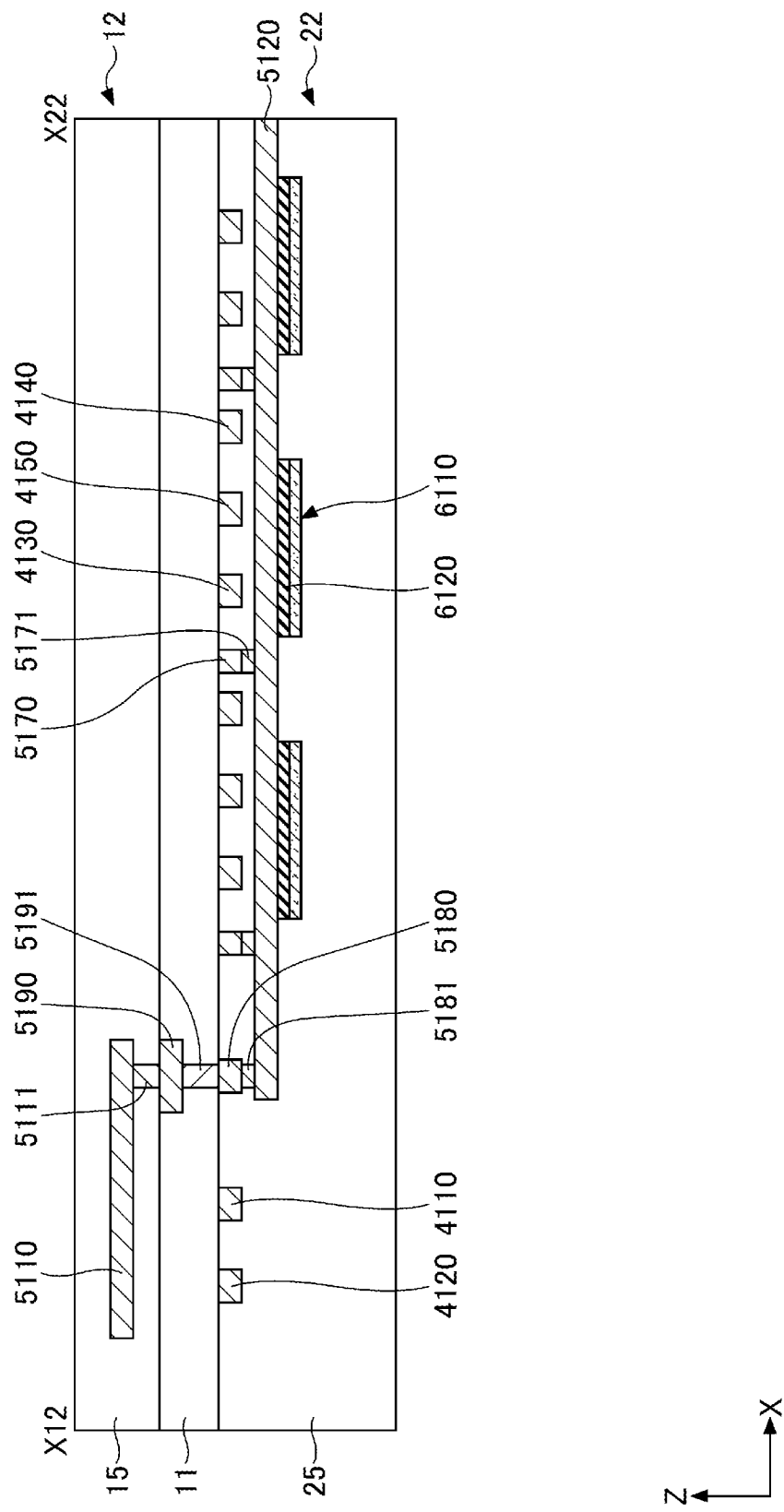
FIG. 12 is a cross-sectional diagram depicting the semiconductor device according to the first embodiment.
Figure 13:
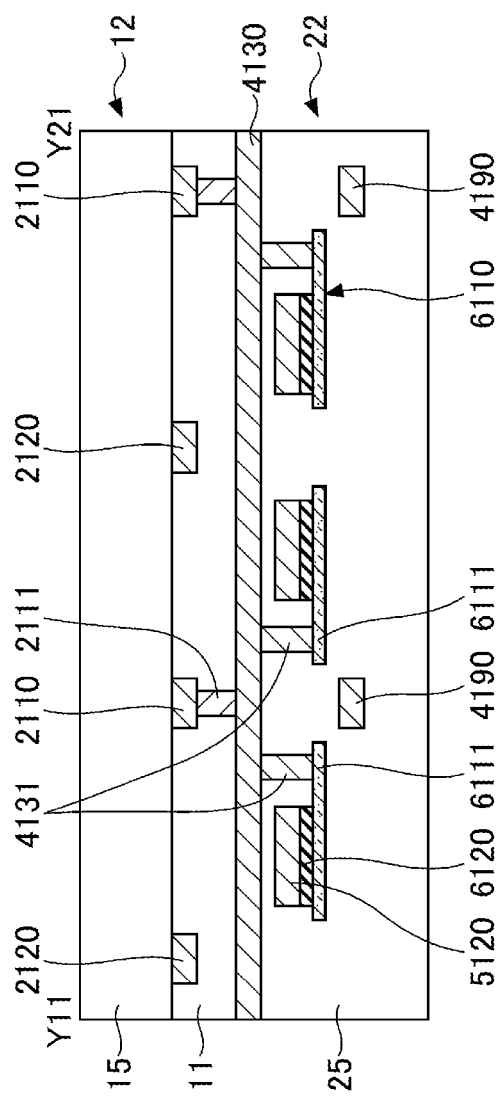
FIG. 13 is a cross-sectional diagram depicting a semiconductor device according to the first embodiment.

Next, the first chip 10 and the second chip 20 according to the first embodiment will be described in detail. FIGS. 9 and 10 are schematic diagrams depicting a configuration of the semiconductor device according to the first embodiment in plan view. FIGS. 11-13 are cross-sectional diagrams depicting the semiconductor device according to the first embodiment. FIG. 9 depicts the internal configuration of the first chip 10 and the second chip 20, and FIG. 10 depicts the internal configuration of the second chip 20. FIG. 11 corresponds to a cross-sectional diagram taken along the X11-X21 line in FIGS. 9 and 10, and FIG. 12 corresponds to a cross-sectional diagram taken along the X12-X22 line in FIGS. 9 and 10, and FIG. 13 corresponds to a cross-sectional diagram taken along the Y11-Y21 line in FIGS. 9 and 10.

[First Power Domain 31A]

In the first power domain 31A, the power lines 1110 extending in the X-direction and the power lines 1120 extending in the X-direction are alternately arranged in the Y-direction. For example, the power lines 1110 correspond to VDD interconnections and the power lines 1120 correspond to VSS interconnections.

As depicted in FIGS. 9-13, a plurality of grooves extending in the X-direction are formed in the substrate 11, and the power lines 1110 and 1120 are formed in these grooves. The power lines 1110 and 1120 of such structures are sometimes referred to as buried power rails (BPR). A device isolation film (not depicted) may be formed on the surface of the substrate 11. The device isolation film is formed, for example, by a shallow trench isolation (STI) method. The surface of the device isolation film may be flush with the surface of the substrate 11 or need not be flush with the surface of the substrate 11.

The substrate 11 has vias 1111 and 1121 that are formed to penetrate the substrate 11 up to the back side thereof. The vias 1111 are formed under the power lines 1110 and the vias 1121 are formed under the power lines 1120. One power line 1110 may be provided with two or more vias 1111, and one power line 1120 may be provided with two or more vias 1121.

Although not depicted in the drawings, circuits, such as the power switch control circuit 52 depicted in FIG. 5, are connected between the power lines 1110 and the power lines 1120. As depicted in FIGS. 9 and 12, control signal lines 5110 for transmitting the outputs of the inverters 61 are positioned between the power lines 1110 and the power lines 1120 in plan view. The control signal lines 5110 extend in plan view up to a region between the first power domain 31A and the second power domain 31B. Grooves are formed in the substrate 11 below ends of the control signal lines 5110 at the second power domain 31B side, and connection layers 5190 are formed in the grooves. The insulating layer 15 has vias 5111 formed therein to electrically connect the control signal lines 5110 and the connection layers 5190. The substrate 11 has vias 5191 formed therein to penetrate the substrate 11 up to the back side thereof. The vias 5191 are formed under the connection layers 5190.

[Second Power Domain 31B]

In the second power domain 31B, power lines 2110 extending in the X-direction and power lines 2120 extending in the X-direction are alternately arranged in the Y-direction. For example, the power lines 2110 correspond to VVDD interconnections and the power lines 2120 correspond to VSS interconnections.

As depicted in FIGS. 9-13, a plurality of grooves extending in the X-direction are formed in the substrate 11, and the power lines 2110 and 2120 are formed in these grooves. The power lines 2110 and 2120 of such structures may be referred to as BPR. A device separation film (not depicted) may be formed on the surface of the substrate 11.

The substrate 11 has vias 2111 and 2121 formed therein to penetrate the substrate 11 up to the back side thereof. The vias 2111 are formed under the power lines 2110 and the vias 2121 are formed under the power lines 2120. One power line 2110 may be provided with two or more vias 2111, and one power line 2120 may be provided with two or more vias 2121.

Although not depicted, circuits included in the standard cells 41, such as the inverters 70 depicted in FIG. 7, are connected between the power lines 2110 and the power lines 2120. SRAM memory cells may be connected between the power lines 2110 and the power lines 2120.

[Power Switch Circuit 42]

As depicted in FIGS. 9-13, the second chip 20 includes, for example, an insulating layer 25 and power lines 4110, 4120, 4130, 4140, and 4150 formed in a surface layer portion of the insulating layer 25. The power lines 4110, 4120, 4130, 4140, and 4150 extend in the Y-direction.

The power lines 4110 and 4120 are provided in a region overlapping the first power domain 31A in plan view. The power lines 4110 correspond to VDD interconnections and the power lines 4120 correspond to VSS interconnections. The power lines 4110 overlap straight lines in which a plurality of vias 1111 are arranged in the Y-direction, and are connected to the power lines 1110 via the vias 1111. The power lines 4120 overlap straight lines in which a plurality of vias 1121 are arranged in the Y-direction, and are connected to the power lines 1120 via the vias 1121.

The power lines 4130, 4140, and 4150 are provided in a region overlapping the second power domain 31B in plan view. The power lines 4130 correspond to VVDD interconnections, the power lines 4140 correspond to VSS interconnections, and the power lines 4150 correspond to VDD interconnections. The power lines 4130 overlap straight lines in which a plurality of vias 2111 are arranged in the Y-direction, and are connected to the power lines 2110 via the vias 2111. The power lines 2110 and 4130 have mesh structures in plan view. The power lines 4140 overlap straight lines in which a plurality of vias 2121 are arranged in the Y-direction, and are connected to the power lines 2120 via the vias 2121. The power lines 2120 and 4140 have mesh structures in plan view.

The second chip 20 includes power lines 4190 and gate electrodes 5120 in the insulating layer 25. The power lines 4190 and the gate electrodes 5120 are located at positions lower than the power lines 4110, 4120, 4130, 4140, and 4150. The power lines 4190 and the gate electrodes 5120 extend in the X-direction.

As depicted in FIGS. 9-11, the power lines 4190 include portions overlapping the power lines 1110 in plan view, portions overlapping the power lines 2110 in plan view, and portions connecting these portions. The power lines 4190 correspond to VDD interconnections. The insulating layer 25 has vias 4191 formed therein to electrically connect the power lines 4110 and the power lines 4190, and vias 4192 formed therein to electrically connect the power lines 4150 and the power lines 4190. The power lines 4150 and 4190 have mesh structures in plan view.

As depicted in FIGS. 9, 10 and 13, the gate electrodes 5120 are positioned between the power lines 2110 and the power lines 2120 in plan view. As depicted in FIG. 12, the gate electrodes 5120 extend in plan view up to a region between the first power domain 31A and the second power domain 31B. Connection sections 5180 are formed in a surface layer portion of the insulating layer 25 above ends of the gate electrodes 5120 at the first power domain 31A side. The connection sections 5180 are connected to the vias 5191. The insulating layer 25 has vias 5181 formed therein to electrically connect the gate electrodes 5120 to the connection sections 5180.

As depicted in FIGS. 9-12, control signal lines 5170 extending in the Y-direction are formed in a surface layer portion of the insulating layer 25. The control signal line 5170 is located on the first power domain 31A side of each power line 4130. The control signal lines 5170, the power lines 4130, the power lines 4150, and the power lines 4140 are arranged repeatedly in the X-direction in this order. The insulating layer 25 has vias 5171 formed therein to electrically connect the control signal lines 5170 and the gate electrodes 5120 that intersect each other. The gate electrodes 5120 and the control signal lines 5170 have mesh structures in plan view.

As depicted in FIGS. 9, 10, 12 and 13, a plurality of semiconductor layers 6110 overlapping pairs of the power lines 4130 and 4150 arranged next to each other are formed in the insulating layer 25 in plan view. The semiconductor layers 6110 are below the gate electrodes 5120, and gate insulating films 6120 are provided between the semiconductor layers 6110 and gate electrodes 5120. The gate insulating films 6120 are in contact with the gate electrodes 5120, and the semiconductor layers 6110 are in contact with the gate insulating film 6120.

The semiconductor layers 6110 include VVDD connection sections 6111 (drains) and VDD connection sections 6112 (sources) on both sides of the centerlines of semiconductor layers 6110 in the Y-direction. The insulating layer 25 has vias 4131 formed therein to electrically connect the VVDD connection sections 6111 and the power lines 4130, and vias 4151 formed therein to electrically connect the VDD connection sections 6112 and the power lines 4150. The plurality of semiconductor layers 6110 are arranged in a grid-like manner.

The power lines 4190 are connected to the VDD connection sections 6112 via the vias 4192, the power lines 4150, and the vias 4151. The VVDD connection sections 6111 are connected to the power lines 2110 via the vias 4131, the power lines 4130, and the vias 2111. The power lines 4190 are supplied with the potential of the VDD, for example, via the pads 23 (see FIG. 1). As noted above, the power lines 2110 correspond to VVDD interconnections. Conductions between the VVDD connection sections 6111 and the VDD connection sections 6112 are thus controlled by the potentials of the gate electrodes 5120. That is, the gate electrodes 5120 function as the gates of switch transistors 51 connected between VDD interconnections and VVDD interconnections.

Thus, in the present embodiment, the switch transistors 51 include the semiconductor layers 6110, and the semiconductor layers 6110 overlap the second power domain 31B in plan view. That is, in plan view, the switch transistors 51 overlap the second power domain 31B.

Thus, in plan view, the size of the semiconductor device can be reduced as compared to a case where the power switch circuits 42 including the switch transistors 51 are positioned independently of the first power domain 31A and the second power domain 31B. A region for power isolation (an isolation region) between the first power domain 31A and the second power domain 31B is used to connect the control signal lines between the first power domain 31A and the second power domain 31B. Also for this reason, the size of the semiconductor device can be reduced. Because the control signal lines are not power potential interconnections such as the VDD interconnections or the VVDD interconnections, it is possible to arrange the control signal lines also in the isolation region.

The VSS interconnections, such as the power lines 1120 in the first power domain 31A, and the VSS interconnections, such as the power lines 2120 in the second power domain 31B, may be connected to each other, or may be separated from each other to act as different nodes. The power lines provided in the second power domain 31B and the power lines provided in the second chip 20 need not have mesh structures in plan view, and the gate electrodes 5120 and the control signal lines 5170 need not have mesh structures in plan view.

In addition, the shape of each via in plan view is not particularly limited and may be, for example, circular, elliptical, square, or rectangular.

Second Embodiment

Figure 14:
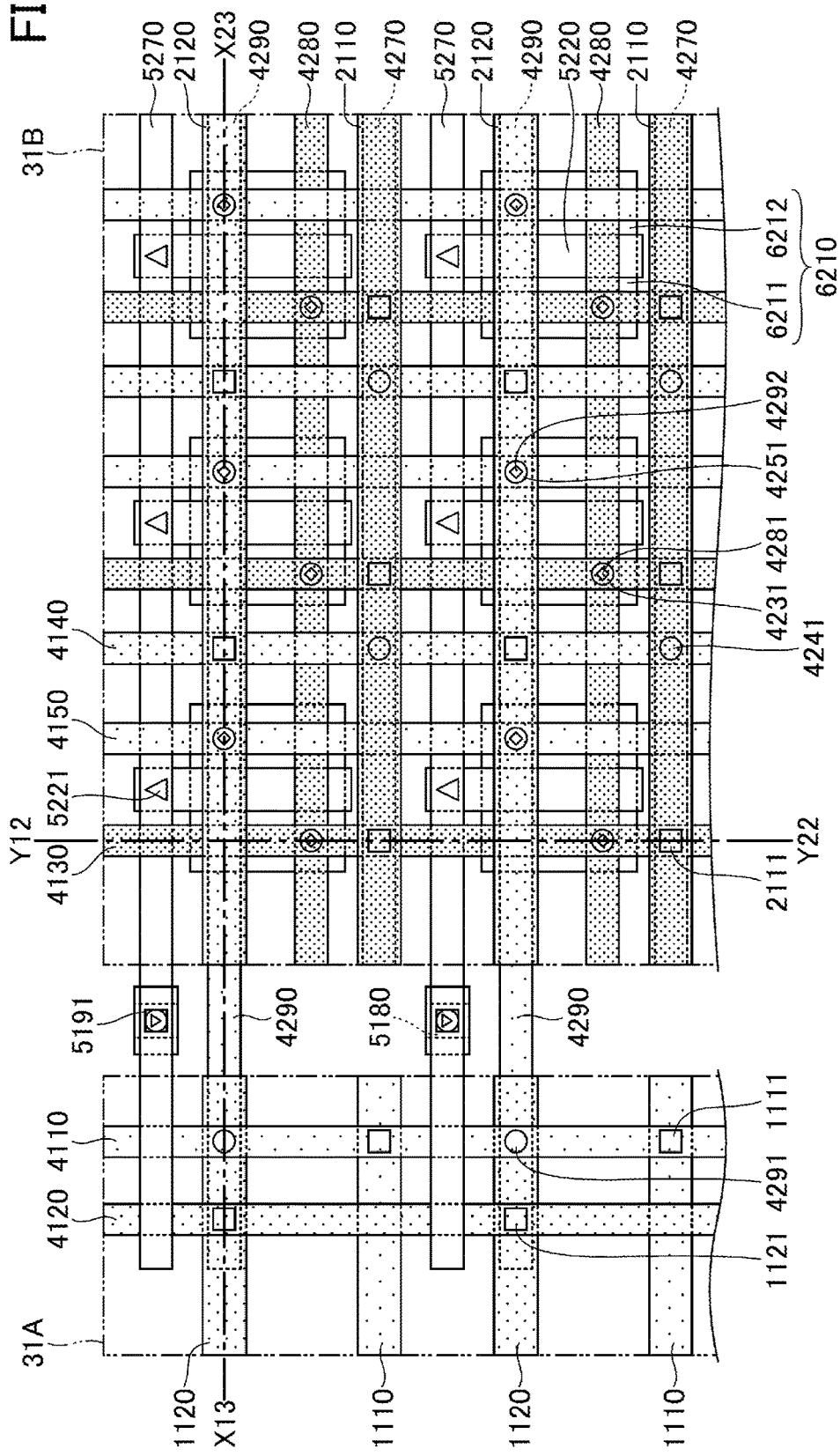
FIG. 14 is a schematic diagram depicting a configuration of a semiconductor device according to a second embodiment in plan view.
Figure 15:
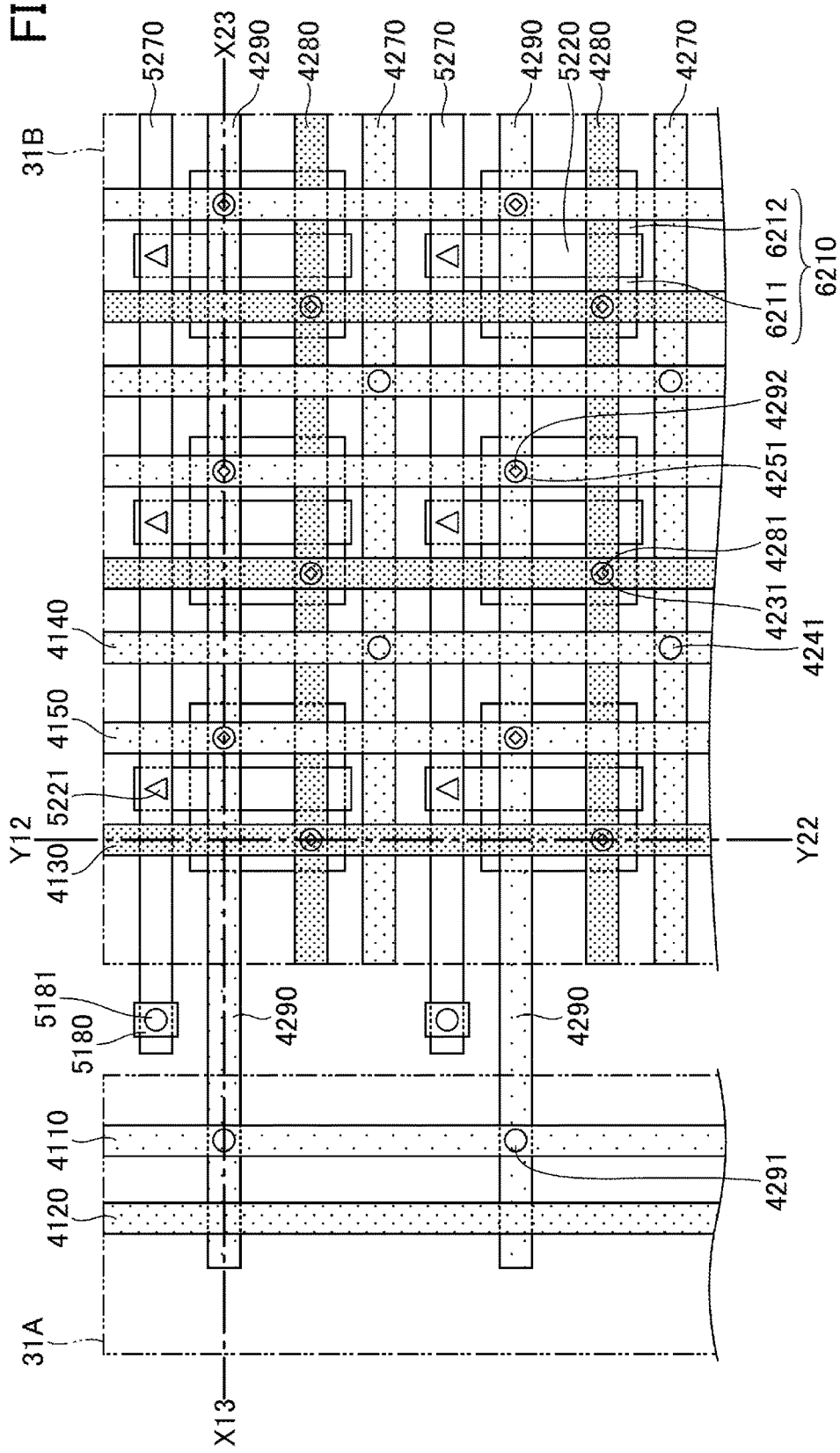
FIG. 15 is a schematic diagram depicting a configuration of the semiconductor device according to the second embodiment in plan view.
Figure 16:
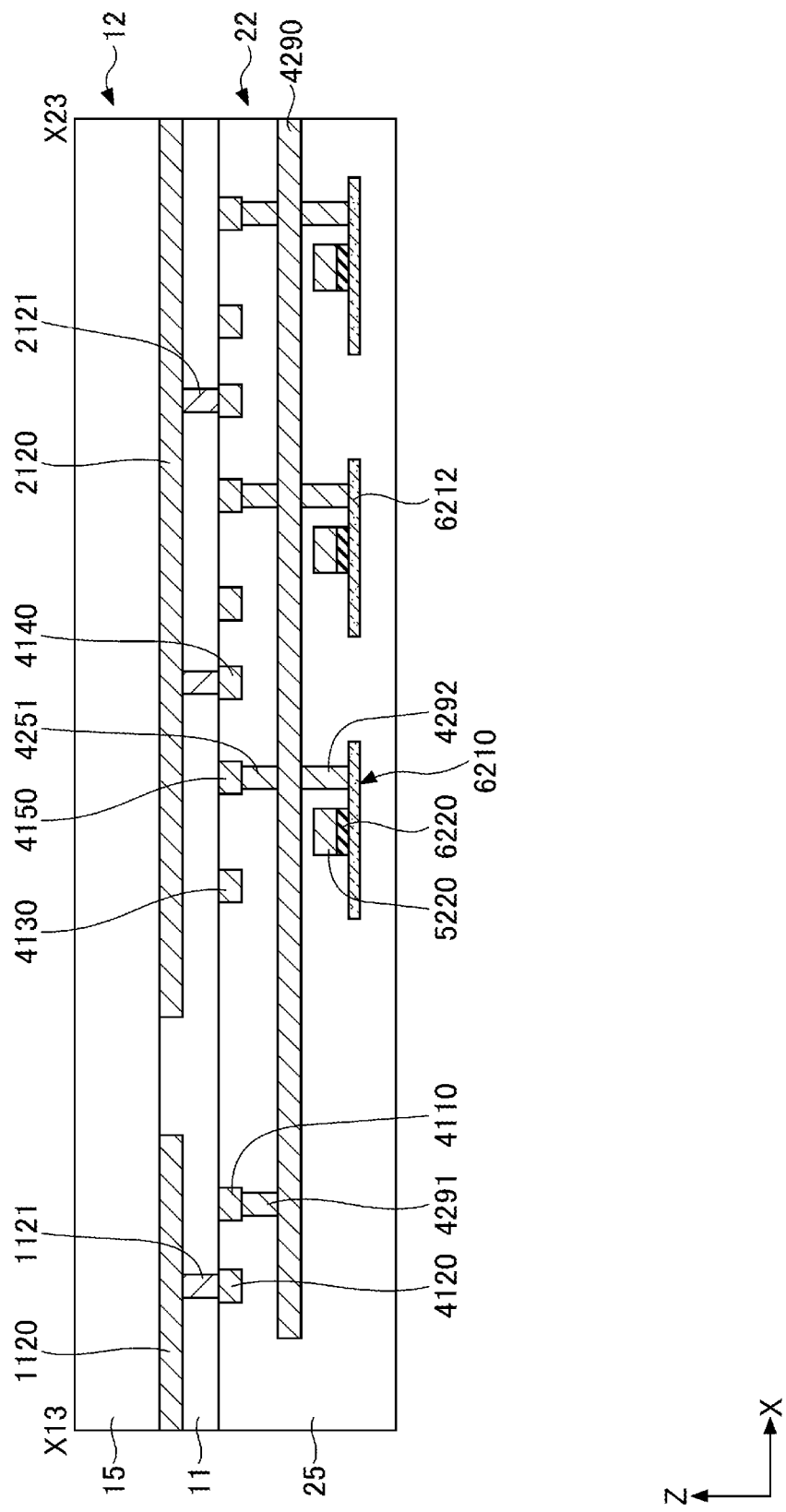
FIG. 16 is a cross-sectional diagram depicting the semiconductor device according to the second embodiment.
Figure 17:
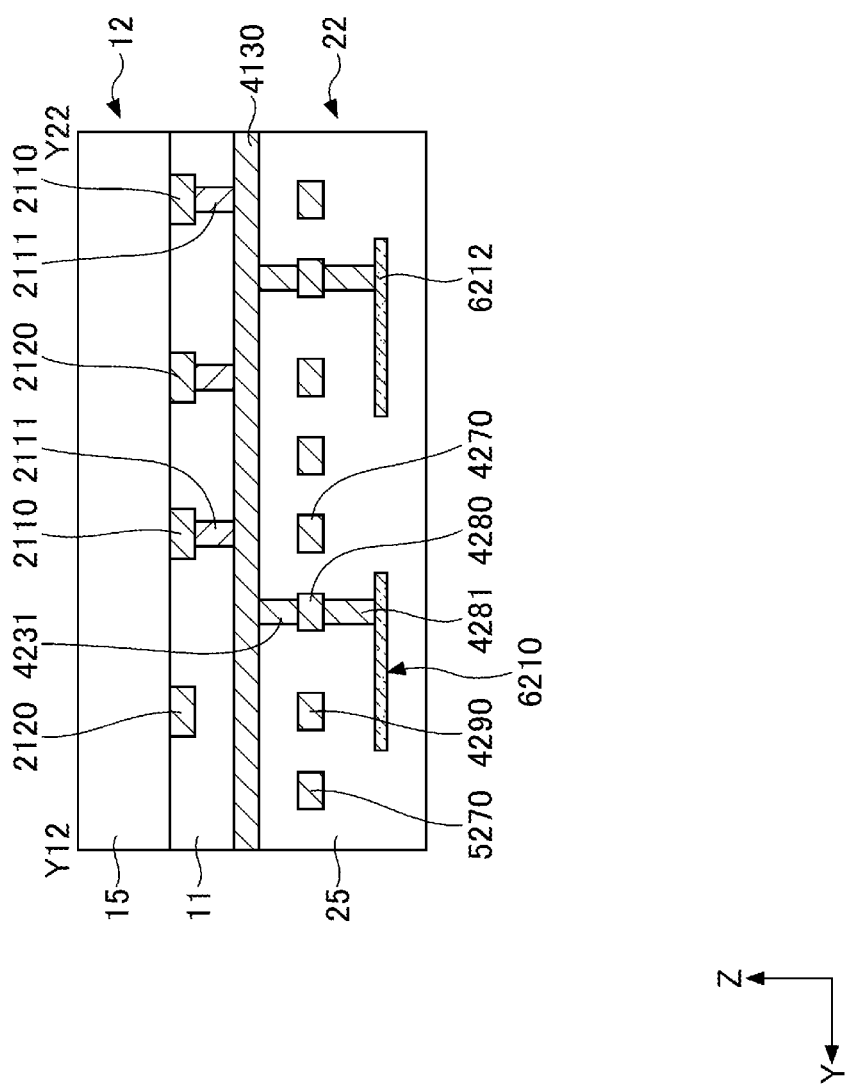
FIG. 17 is a cross-sectional diagram depicting the semiconductor device according to the second embodiment.

Next, a second embodiment will be described. The second embodiment differs from the first embodiment mainly in the arrangement of the gate electrodes. FIGS. 14 and 15 are schematic diagrams depicting a configuration of a semiconductor device according to the second embodiment in plan view. FIGS. 16 and 17 are cross-sectional diagrams depicting the semiconductor device according to the second embodiment. FIG. 14 depicts internal configurations of the first chip 10 and the second chip 20, and FIG. 15 depicts the internal configuration of the second chip 20. FIG. 16 corresponds to a cross-sectional diagram taken along the line X13-X23 in FIGS. 14 and 15, and FIG. 17 corresponds to a cross-sectional diagram taken along the line Y12-Y22 in FIGS. 14 and 15.

In the second embodiment, similar to the first embodiment, the second chip 20 includes, for example, the insulating layer 25 and the power lines 4110, 4120, 4130, 4140, and 4150 formed in a surface layer portion of the insulating layer 25. The power lines 4110, 4120, 4130, 4140, and 4150 extend in the Y-direction.

The second chip 20 further includes power lines 4270, 4280, and 4290 in the insulating layer 25. The power lines 4270, 4280, and 4290 extend in the X-direction. The power lines 4270, 4280, and 4290 are provided in regions overlapping the second power domain 31B in plan view. The power lines 4270, 4280 and 4290 are located at positions below the power lines 4110, 4120, 4130, 4140 and 4150. The power lines 4280 correspond to VVDD interconnections, the power lines 4270 correspond to VSS interconnections, and the power lines 4290 correspond to VDD interconnections.

As depicted in FIGS. 14-16, the power lines 4290 include portions overlapping the power lines 1120 in plan view, portions overlapping the power lines 2120 in plan view, and portions connecting these portions. The insulating layer 25 has vias 4291 formed therein to electrically connect the power lines 4110 to the power lines 4290 and vias 4251 formed therein to electrically connect the power lines 4150 to the power lines 4290. As depicted in FIGS. 14, 15 and 17, the insulating layer 25 has vias 4231 formed therein to electrically connect the power lines 4130 and the power lines 4280 and vias 4241 formed therein to electrically connect the power lines 4140 and the power lines 4270.

As depicted in FIGS. 14, 15 and 17, the second chip 20 includes control signal lines 5270 in the insulating layer 25. The control signal lines 5270 are in positions lower than the power lines 4110, 4120, 4130, 4140, and 4150. The control signal lines 5270 extend in the X-direction. The control signal lines 5270 are positioned in plan view between the power lines 2110 and the power lines 2120 that are in the direction opposite to the Y-direction with respect to the power lines 2110. The power lines 4270, power lines 4280, power lines 4290, and the control signal lines 5270 are repeatedly arranged in the Y-direction in this order. The control signal lines 5270 extend in plan view to a region between the first power domain 31A and the second power domain 31B. Connection sections 5180 are formed in a surface layer portion of the insulating layer 25 above ends of the control signal lines 5270 at the first power domain 31A side. The connection sections 5180 are connected to the vias 5191. The insulating layer 25 has vias 5181 formed therein to electrically connect the control signal lines 5270 and the connection sections 5180.

As depicted in FIGS. 14-17, the insulating layer 25 has the gate electrodes 5220 formed therein extending in the Y-direction and overlapping sets of the power lines 4280, the power lines 4290, and control signal lines 5270 in plan view. The gate electrodes 5220 are positioned in plan view between the power lines 4130 and 4150 arranged next to each other. The gate electrodes 5220 are in positions lower than the power lines 4270, the power lines 4280, the power lines 4290, and the control signal lines 5270. As depicted in FIGS. 14 and 15, the insulating layer 25 has vias 5221 formed therein to electrically connect the gate electrodes 5220 to the control signal lines 5270.

As depicted in FIGS. 14-17, the insulating layer 25 has semiconductor layers 6210 formed therein overlapping in plan view the power lines 4130 and 4150 arranged next to each other and overlapping in plan view the power lines 4280 and 4290 arranged next to each other. The semiconductor layers 6210 are in positions lower than the gate electrodes 5220 and are provided with gate insulating films 6220 between the semiconductor layers 6210 and the gate electrodes 5220. The gate insulating films 6220 are in contact with the gate electrodes 5220, and the semiconductor layers 6210 are in contact with the gate insulating films 6220.

The semiconductor layers 6210 have VVDD connection sections 6211 that are in the direction opposite to the X-direction with respect to the gate electrodes 5220 in plan view and VDD connection sections 6212 that are in the X-direction with respect to the gate electrodes 5220 in plan view. The insulating layer 25 has vias 4281 formed therein to electrically connect the VVDD connection sections 6211 to the power lines 4280 and vias 4292 formed therein to electrically connect the VDD connection sections 6212 to the power lines 4290.

As depicted in FIG. 16, the power lines 4290 are connected to the VDD connection sections 6212 via the vias 4292. As depicted in FIG. 17, VVDD connection sections 6211 are connected to the power lines 2110 via the vias 4281, the power lines 4280, the vias 4231, the power lines 4130, and the vias 2111. The power lines 4290 are supplied with the potential of VDD, for example, via pads 23 (see FIG. 1). Also, as noted above, the power lines 2110 correspond to VVDD interconnections. Conductions between the VVDD connection sections 6211 and the VDD connection sections 6212 are thus controlled by the potentials of the gate electrodes 5220. That is, the gate electrodes 5220 function as the gates of switch transistors 51 connected between the VDD interconnections and the VVDD interconnections.

The other configurations are the same as or similar to those of the first embodiment.

In the present embodiment, the switch transistors 51 include the semiconductor layers 6210, and the semiconductor layers 6210 overlap the second power domain 31B in plan view. That is, in plan view, the switch transistors 51 overlap the second power domain 31B.

Thus, as in the first embodiment, the size of the semiconductor device can be reduced.

Third Embodiment

Figure 18:
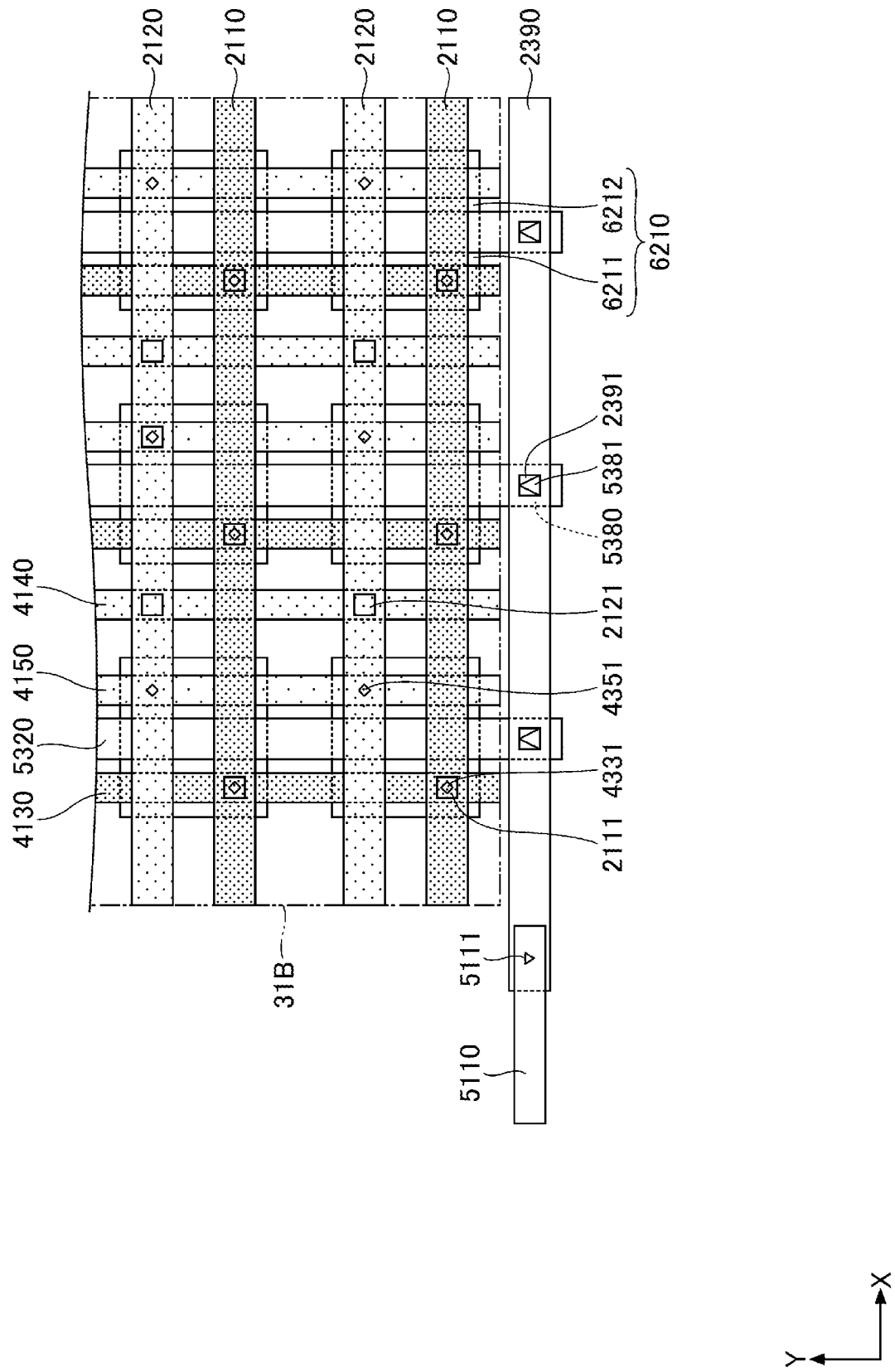
FIG. 18 is a schematic diagram depicting a configuration of a semiconductor device according to a third embodiment in plan view.
Figure 19:
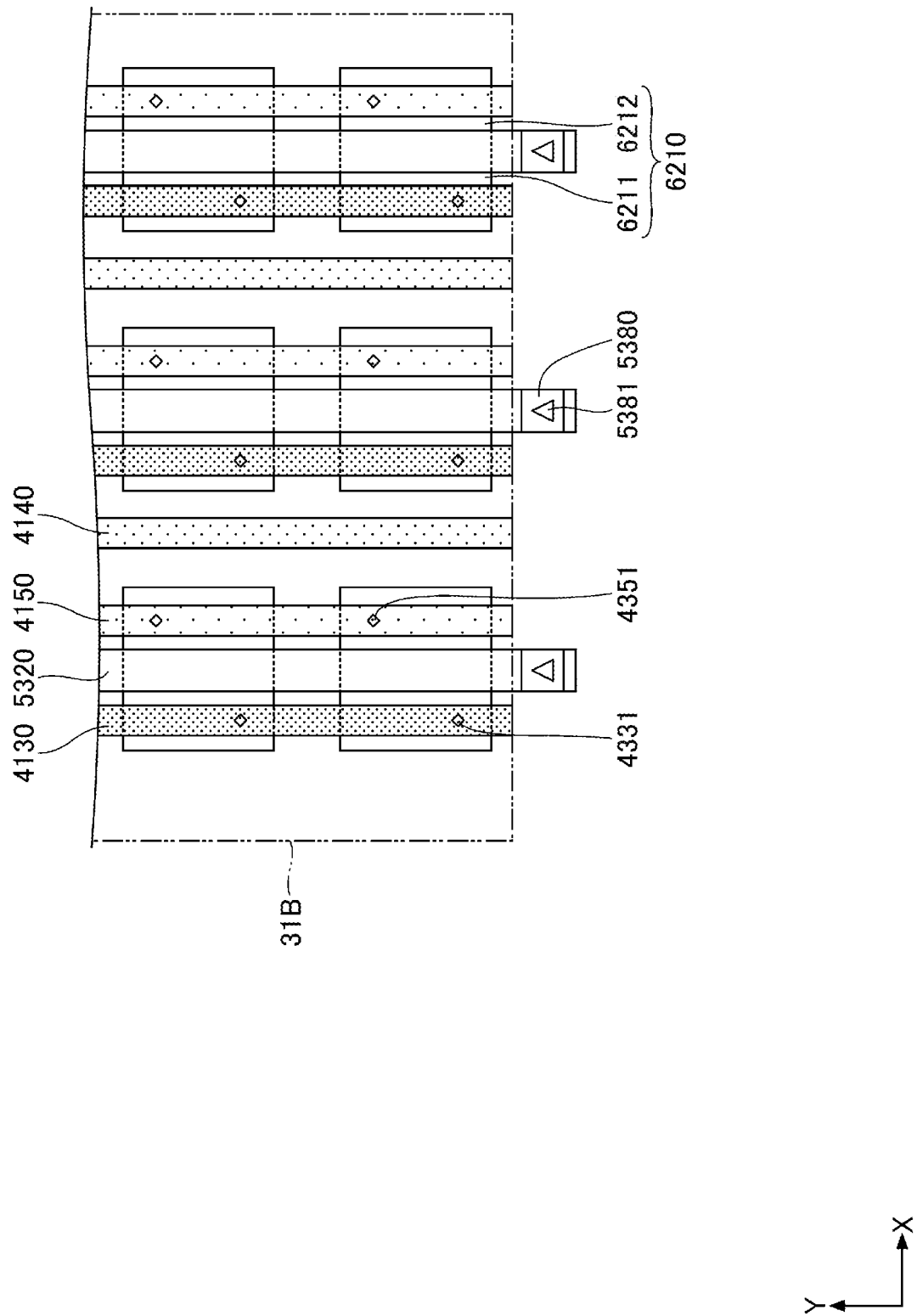
FIG. 19 is a schematic diagram depicting a configuration of the semiconductor device according to the third embodiment in plan view.

Next, a third embodiment will be described. The third embodiment differs from the first embodiment, etc., mainly in the arrangement of the gate electrodes and the control signal lines. FIGS. 18 and 19 are schematic diagrams depicting a configuration of a semiconductor device according to the third embodiment in plan view. FIG. 18 depicts internal configurations of the first chip 10 and the second chip 20, and FIG. 19 depicts the internal configuration of the second chip 20. In FIGS. 18 and 19, the portion corresponding to the first power domain 31A is omitted.

In the third embodiment, the first chip 10 includes the control signal line 2390 extending in the X-direction, in the direction opposite to the Y-direction with respect to the second power domain 31B. The control signal line 2390 is, for example, a BPR. The substrate 11 has vias 2391 formed therein to penetrate the substrate 11 to the back side. The vias 2391 are formed under the control signal line 2390. The control signal line 5110 is connected to the control signal line 2390 via a via 5111 formed in the insulating layer 15.

The second chip 20, similar to the first embodiment, includes, for example, power lines 4130, 4140, and 4150 in regions overlapping the second power domain 31B. The power lines 4130, 4140 and 4150 extend in the Y-direction.

The second chip 20 includes gate electrodes 5320 extending in the Y-direction in the insulating layer 25. The gate electrodes 5320 are in positions lower than the power lines 4130, 4140 and 4150. The gate electrodes 5320 are positioned in plan view between the power lines 4130 and 4150 arranged next to each other. The gate electrodes 5320 include portions overlapping the control signal line 2390 in plan view. As depicted in FIG. 19, connection sections 5380 are formed in a surface layer portion of the insulating layer 25 above portions of the gate electrodes 5320 overlapping the control signal line 2390 in plan view. The insulating layer 25 has vias 5381 formed therein to electrically connect the gate electrodes 5320 to the connection sections 5380.

As depicted in FIGS. 18 and 19, the insulating layer 25 has semiconductor layers 6210 formed therein overlapping in plan view the power lines 4130 and 4150 arranged next to each other and overlapping in plan view the power lines 2110 and 2120 arranged next to each other. The semiconductor layers 6210 are in positions lower than the gate electrodes 5320. Similar to the second embodiment, gate insulating films 6220 are provided between the semiconductor layers 6210 and the gate electrodes 5320, wherein the gate insulating films 6220 are in contact with the gate electrodes 5320 and the semiconductor layers 6210 are in contact with the gate insulating films 6220.

The semiconductor layers 6210 include VVDD connection sections 6211 that are in the direction opposite to the X-direction with respect to the gate electrodes 5320 in plan view and VDD connection sections 6212 that are in the X-direction with respect to the gate electrodes 5320 in plan view. The insulating layer 25 has vias 4331 formed therein to electrically connect the VVDD connection sections 6211 to the power lines 4130 and vias 4351 formed therein to electrically connect the VDD connection sections 6212 to the power lines 4150.

The other configurations are the same as or similar to those of the second embodiment.

In the present embodiment, the switch transistors 51 include the semiconductor layers 6210, and the semiconductor layers 6210 overlap the second power domain 31B in plan view. That is, in plan view, the switch transistors 51 overlap the second power domain 31B.

Therefore, the size of the semiconductor device can be reduced, similar to the first embodiment and the like. Also, because the number of control signal lines extending in the X-direction can be reduced, the size of the semiconductor device can be further reduced.

Similar to the first embodiment, the power lines 4150, which are examples of the VDD interconnections, may be connected to the power lines 4110 or the like in the first power domain 31A via the power lines 4190.

Fourth Embodiment

Figure 20:
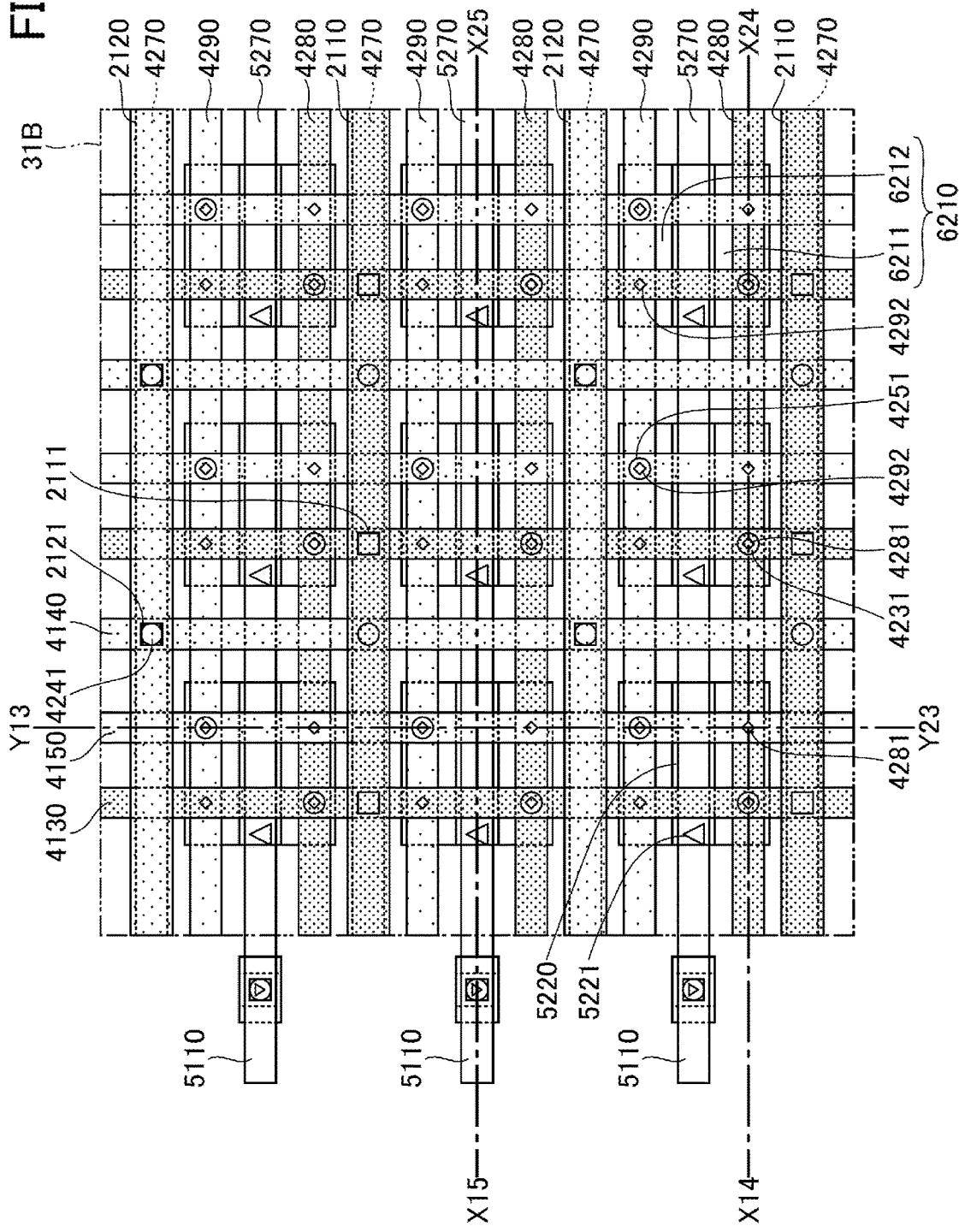
FIG. 20 is a schematic diagram depicting a configuration of a semiconductor device according to a fourth embodiment in plan view.
Figure 21:
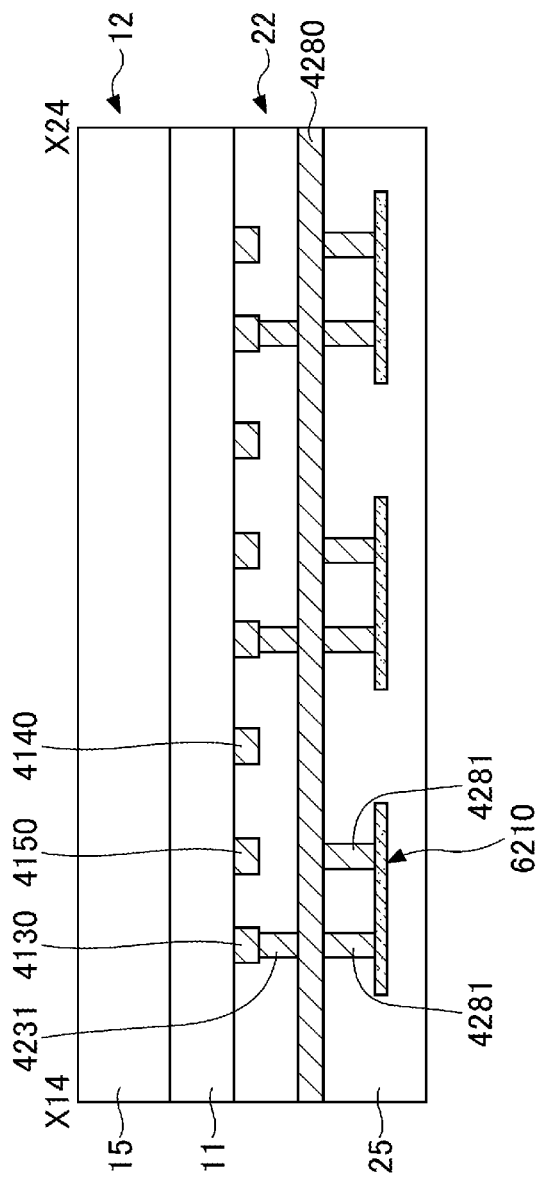
FIG. 21 is a cross-sectional diagram depicting the semiconductor device according to the fourth embodiment.
Figure 22:
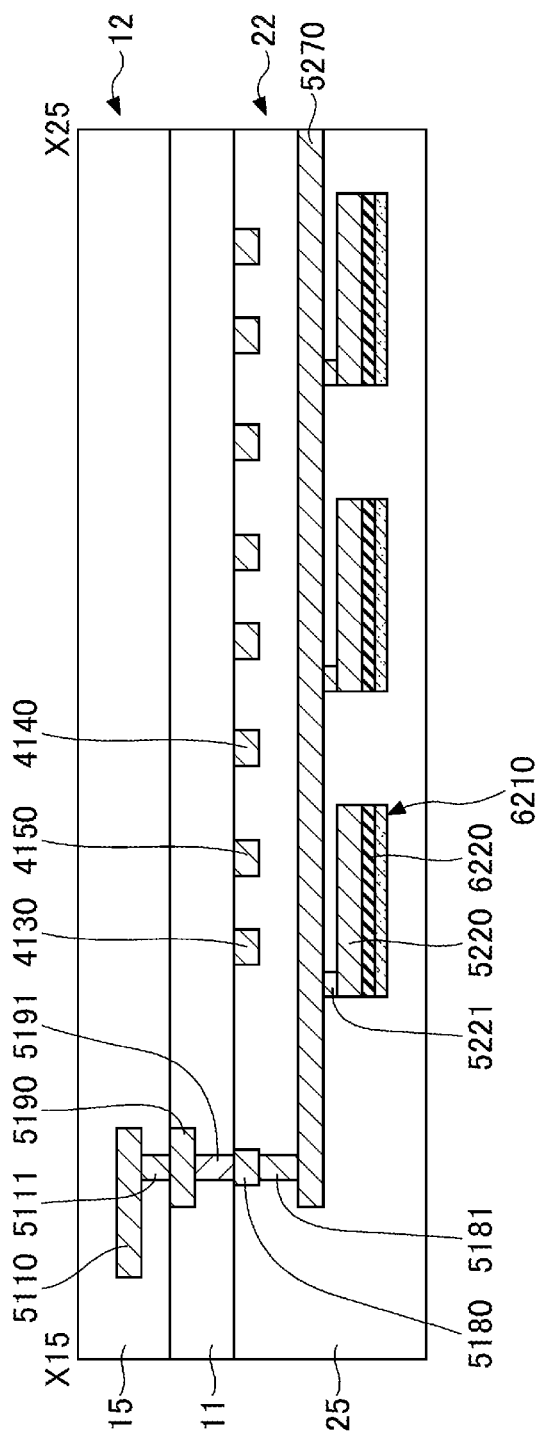
FIG. 22 is a cross-sectional diagram depicting the semiconductor device according to the fourth embodiment.
Figure 23:
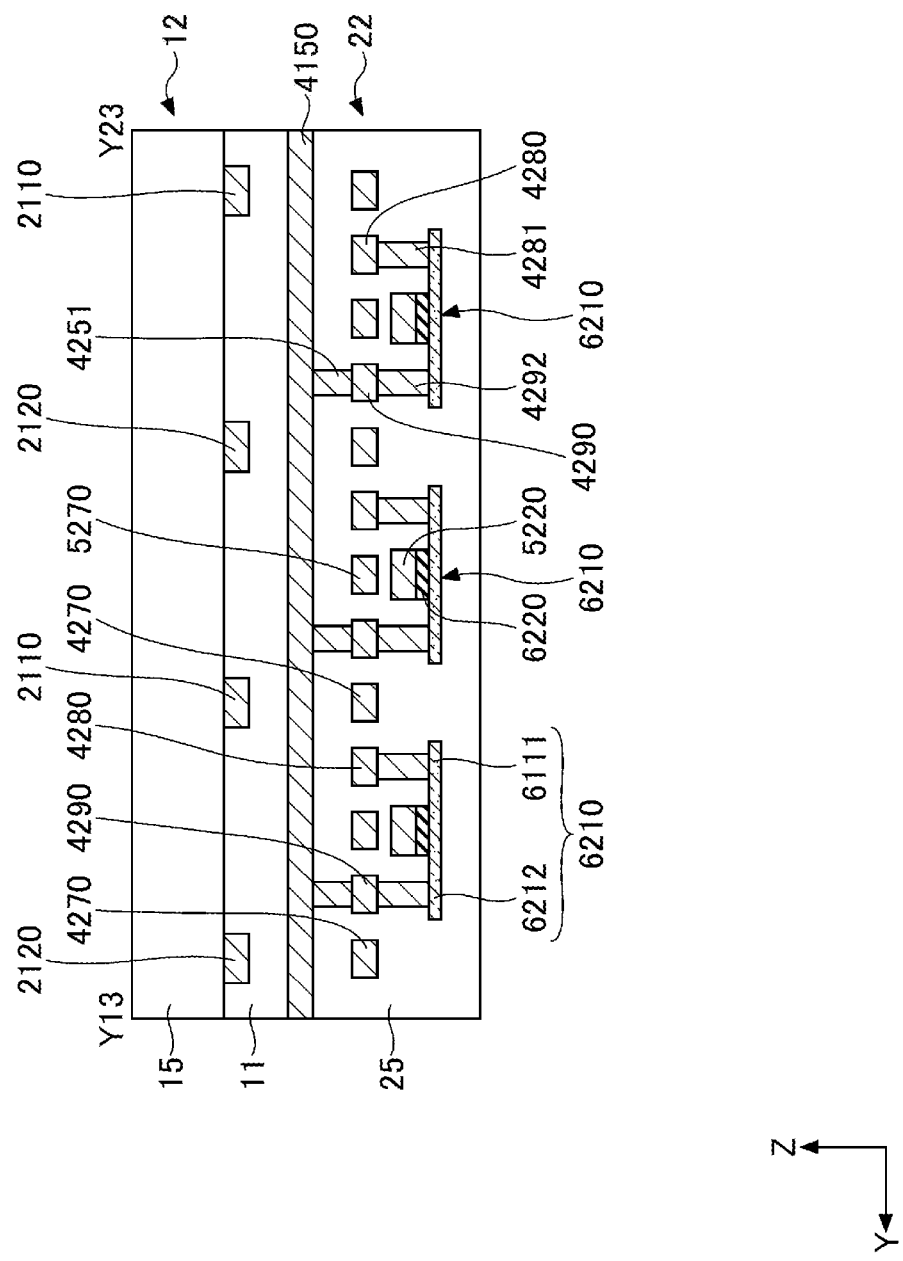
FIG. 23 is a cross-sectional diagram depicting the semiconductor device according to the fourth embodiment.

Next, a fourth embodiment will be described. The fourth embodiment differs from the first embodiment, etc., mainly in the arrangement of the gate electrodes. FIG. 20 is a schematic diagram depicting a configuration of a semiconductor device according to the fourth embodiment in plan view. FIGS. 21 to 23 are cross-sectional diagrams depicting the semiconductor device according to the fourth embodiment. FIG. 21 corresponds to a cross-sectional diagram taken along the X14-X24 line in FIG. 20; FIG. 22 corresponds to a cross-sectional diagram taken along the X15-X25 line in FIG. 20; and FIG. 23 corresponds to a cross-sectional diagram taken along the Y13-Y23 line in FIG. 20. In FIGS. 20-22, the portion corresponding to the first power domain 31A is omitted.

In the fourth embodiment, the control signal lines 5270 are provided above the semiconductor layers 6210 and are positioned in plan view between the power lines 4280 and the power lines 4290. The gate electrode 5220 is provided for each semiconductor layer 6210 and extends in the X-direction below the control signal line 5270. Vias 5221 electrically connecting the gate electrodes 5220 and the control signal lines 5270 are positioned above the semiconductor layers 6210. A plurality of vias 4281 may be provided for one VVDD connection section 6211 and a plurality of vias 4292 may be provided for one VDD connection section 6212. For example, the power lines 4270, 4280, and 4290 and the control signal lines 5270 are in positions higher than the gate electrodes 5220.

The other configurations are the same as or similar to those of the first embodiment.

Also the fourth embodiment can have the same advantageous effects as those of the first embodiment.

In addition, the gate electrode 5220 is provided for each switch transistor 51, and the plurality of gate electrodes 5220 arranged in the X-direction are in common connected to one control signal line 5270. Therefore, the gate electrodes 5220 and the gate insulating films 6220 are easily formed. That is, the gate electrodes 5220 and the gate insulating films 6220 do not protrude from the semiconductor layers 6210 in plan view, so that the gate electrodes 5220 and the gate insulating films 6220 are easily formed. Also in the other embodiments, the gate electrodes and the gate insulating films may be configured such that they do not protrude from the semiconductor layers in plan view. Also in the other embodiments, a plurality of gate electrodes arranged in the X-direction may be configured so that they are in common connected to one control signal line in plan view.

Fifth Embodiment

Figure 24:
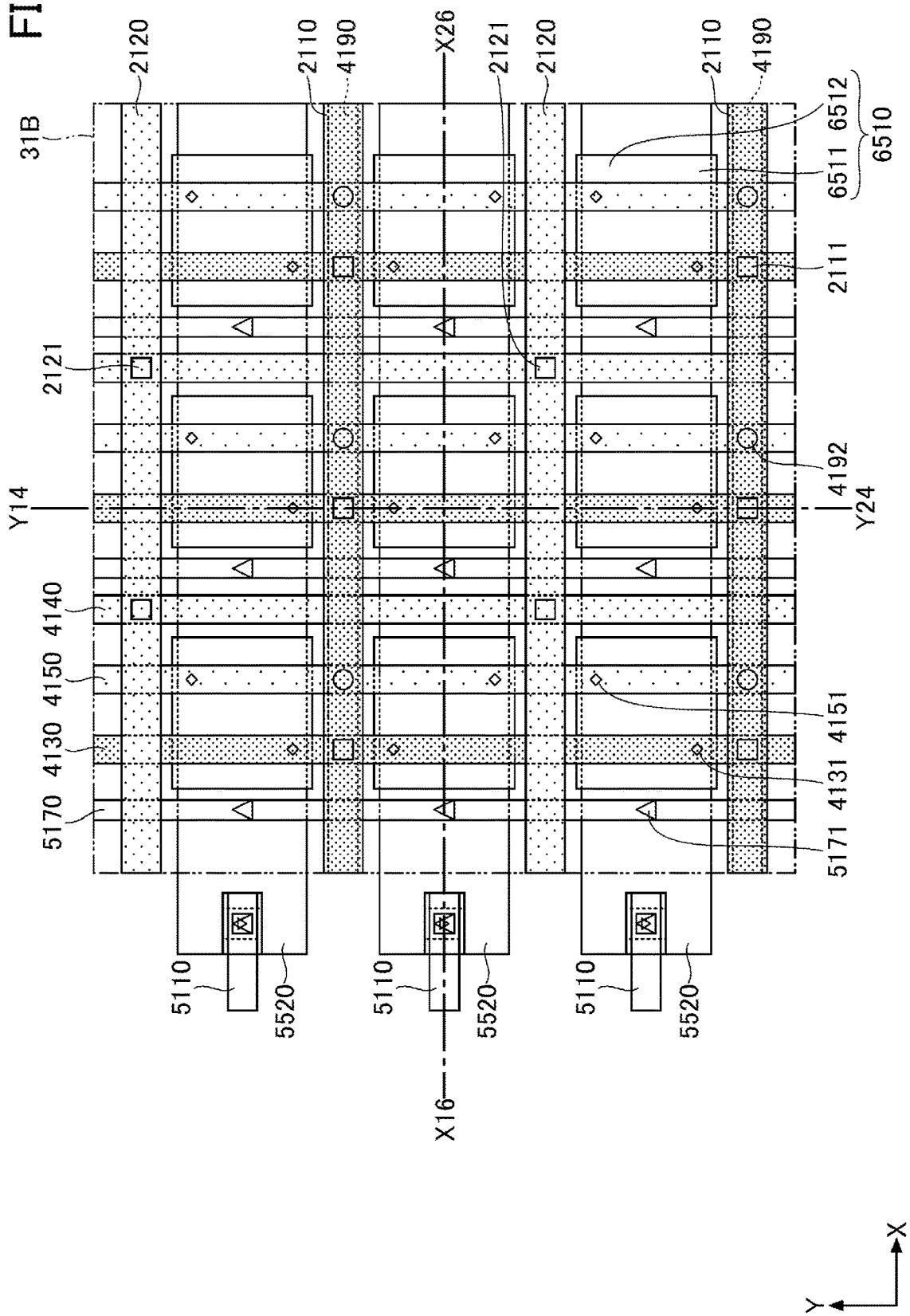
FIG. 24 is a schematic diagram depicting a configuration of a semiconductor device according to a fifth embodiment in plan view.
Figure 25:
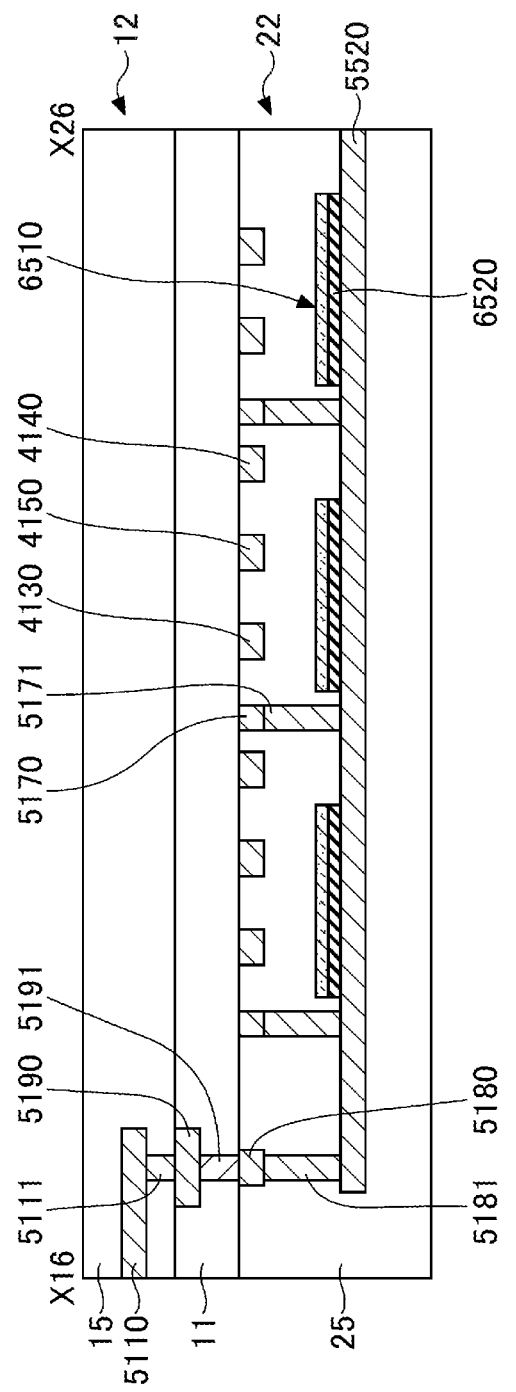
FIG. 25 is a cross-sectional diagram depicting a semiconductor device according to a fifth embodiment.
Figure 26:
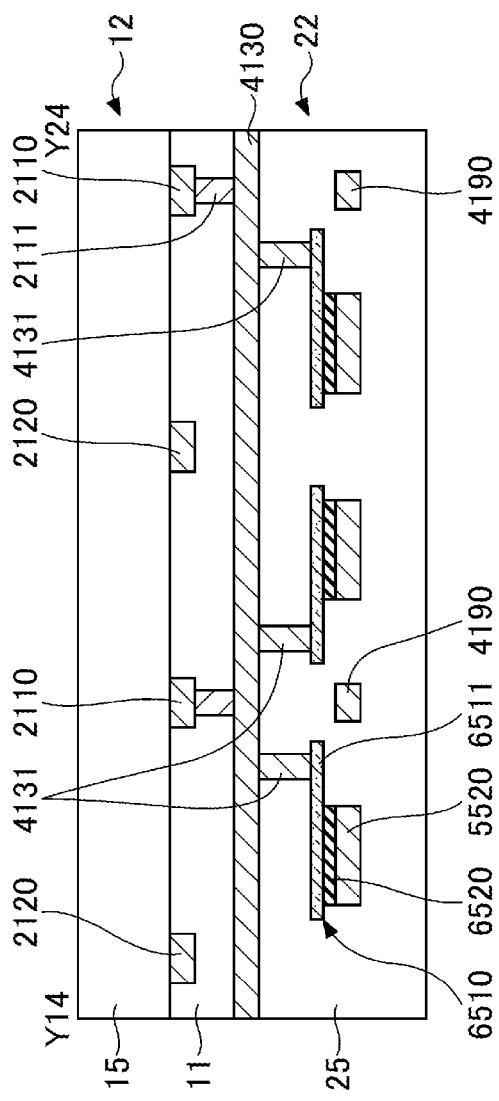
FIG. 26 is a cross-sectional diagram depicting the semiconductor device according to the fifth embodiment.

Next, a fifth embodiment will be described. The fifth embodiment is different from the first embodiment, etc., mainly in the structures of the switch transistors. FIG. 24 is a schematic diagram depicting a configuration of a semiconductor device according to the fifth embodiment in plan view. FIGS. 25 and 26 are cross-sectional diagrams depicting the semiconductor device according to the fifth embodiment. FIG. 25 corresponds to a cross-sectional diagram taken along the line X16-X26 in FIG. 24, and FIG. 26 corresponds to a cross-sectional diagram taken along the line Y14-Y24 in FIG. 24. In FIGS. 24 and 25, the portion corresponding to the first power domain 31A is omitted.

In the fifth embodiment, the second chip 20 includes power lines 4190 and gate electrodes 5520 in the insulating layer 25. The power lines 4190 and gate electrodes 5520 are in positions lower than the power lines 4110, 4120, 4130, 4140 and 4150. The power lines 4190 and gate electrodes 5520 extend in the X-direction.

As depicted in FIGS. 24-26, the insulating layer 25 has semiconductor layers 6510 formed therein between the power lines 2110 and the power lines 2120 in the Y-direction and between the control signal lines 5170 and the power lines 4130 that are on both sides of the power lines 4130 and 4150 in the X-direction. The semiconductor layers 6510 are positioned above the gate electrodes 5520, and gate insulating films 6520 are provided between the semiconductor layers 6510 and the gate electrodes 5520. The gate insulating films 6520 are in contact with the gate electrodes 5520, and the semiconductor layers 6510 are in contact with the gate insulating films 6520.

The semiconductor layers 6510 include VVDD connection sections 6511 and VDD connection sections 6512 on both sides of centerlines of the semiconductor layers 6510 in plan view. The insulating layer 25 has vias 4131 formed therein to electrically connect the VVDD connection sections 6511 to the power lines 4130 and vias 4151 formed therein to electrically connect the VDD connection sections 6512 to the power lines 4150.

The other configurations are the same as or similar to those of the first embodiment.

Also the fifth embodiment can have the same advantageous effects as those of the first embodiment.

The gate electrodes 5520 may be formed in the same layer as that of the power lines 4190 and the like. The gate electrodes 5520 may be formed of the same material as the power lines 4190 and the like.

Also in the other embodiments, the gate electrodes and the gate insulating films may be in positions lower than the semiconductor layers.

Sixth Embodiment

Figure 27:
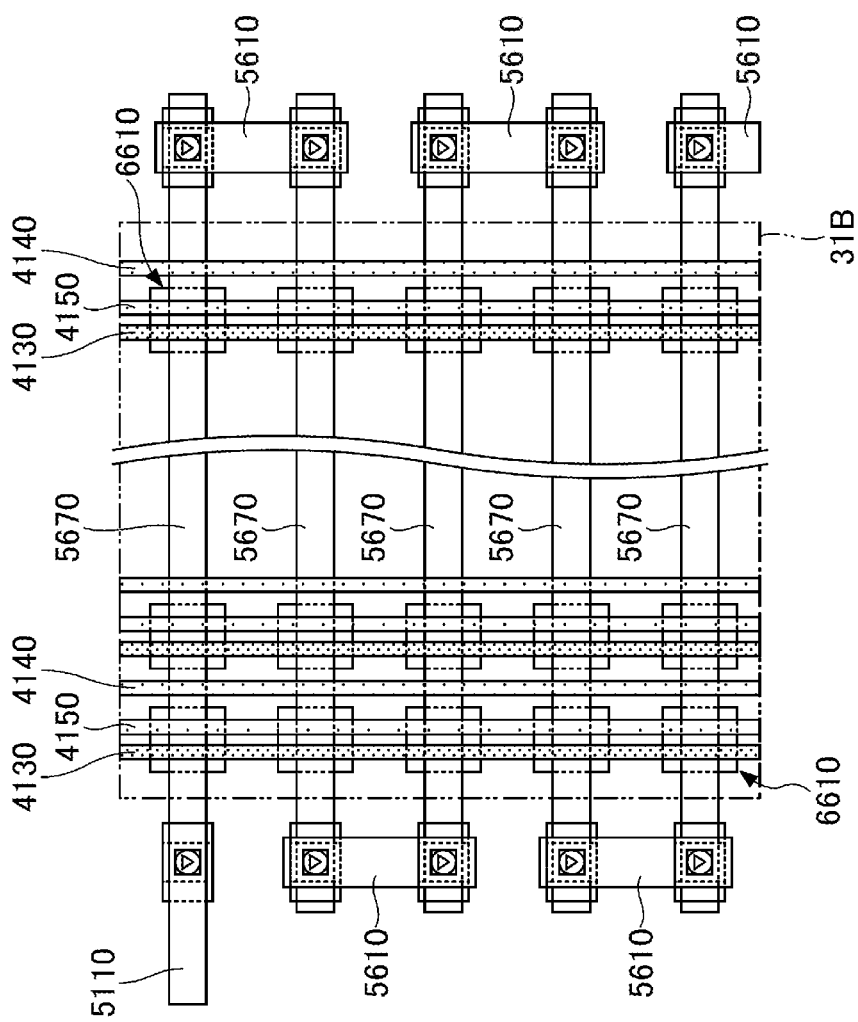
FIG. 27 is a schematic diagram depicting a configuration of a semiconductor device according to a sixth embodiment in plan view.

Next, a sixth embodiment will be described. The sixth embodiment differs from the first embodiment, etc., in the arrangement of the control signal lines. FIG. 27 is a schematic diagram depicting a configuration of a semiconductor device according to the sixth embodiment in plan view. In FIG. 27, the portion corresponding to the first power domain 31A is omitted. FIG. 27 in particular depicts portions concerning the arrangement of control signal lines in the sixth embodiment, and omits some power lines and vias.

In the sixth embodiment, a plurality of control signal lines 5670 are disposed in the insulating layer 25, as depicted in FIG. 27. The control signal lines 5670 extend in the X-direction and are arranged side by side in the Y-direction. Each control signal line 5670 has a portion extending beyond both ends of the second power domain 31B in the X-direction. The control signal lines 5670 arranged next to each other in the Y-direction are connected to each other via control signal lines 5610 extending in the Y-direction outside of the second power domain 31B. The control signal line 5670 connected at the side in the direction opposite to the X-direction via the control signal line 5610 to the control signal line 5670 that is immediately next thereto in the Y-direction is connected at the side in the X-direction via the control signal line 5610 to the control signal line 5670 that is immediately next thereto in the direction opposite to the Y-direction. In the same way, the control signal line 5670 connected at the side in the X-direction via the control signal line 5610 to the control signal line 5670 that is immediately next thereto in the Y-direction is connected at the side in the direction opposite to the X-direction via the control signal line 5610 to the control signal line 5670 that is immediately next thereto in the direction opposite to the Y-direction. Thus, in the present embodiment, a continuous body made of the control signal line 5110, the control signal line 5670, the control signal line 5610, the control signal line 5670, the control signal line 5610, . . . , is serpentine in plan view. The control signal lines 5670 next to each other in the Y-direction are connected to each other only on the outside of the second power domain 31B. The gate electrodes (not depicted) of the switch transistors 51 are connected to the control signal lines 5670. That is, the plurality of switch transistors 51 are connected in parallel.

In the sixth embodiment, the parasitic capacitances and resistances with respect to the control signal lines 5670 are great. A control signal from the power switch control circuit is sequentially transmitted to each switch transistor 51 through the control signal lines 5670. Therefore, VVDD potential rise in the second power domain 31B can be made gentler, and power source noise occurring due to steep potential rise can be reduced.

The control signal lines 5670 arranged side by side in the Y-direction may be connected together outside of the second power domain 31B in plan view via control signal lines provided in a surface layer portion of the second chip 20 instead of the control signal lines 5610.

Seventh Embodiment

Figure 28:
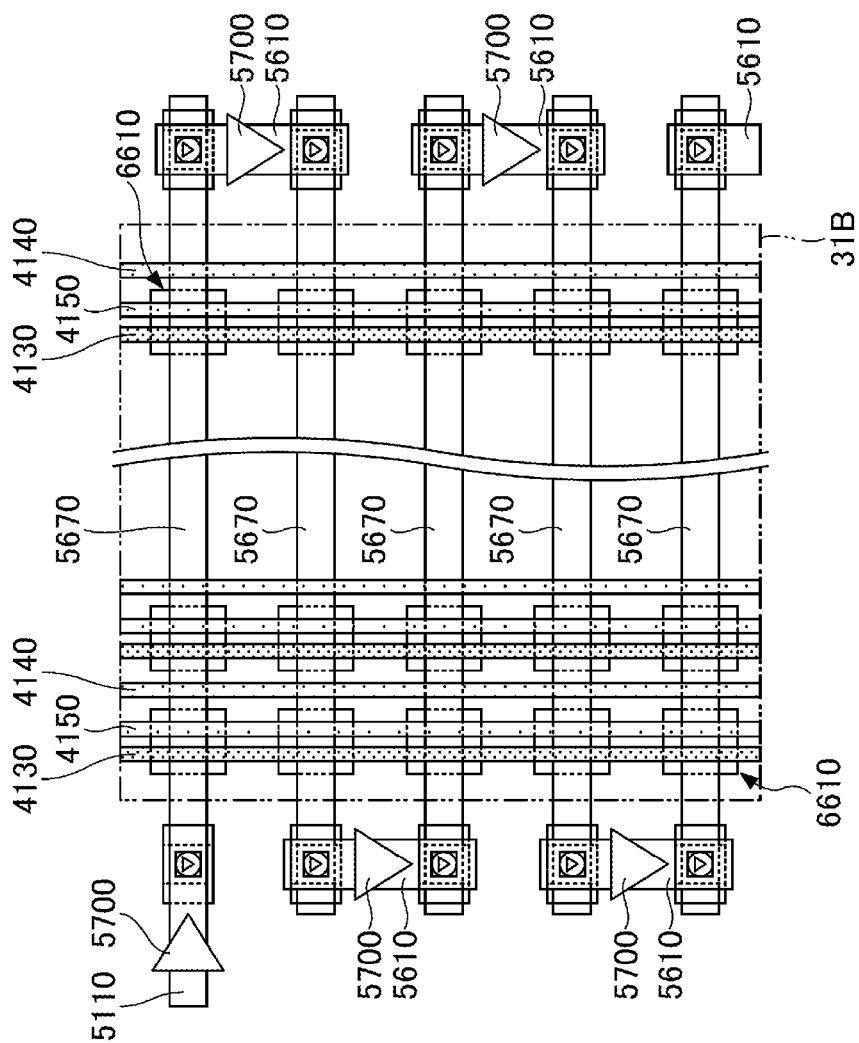
FIG. 28 is a schematic diagram depicting a configuration of a semiconductor device according to a seventh embodiment in plan view.

Next, a seventh embodiment will be described. The seventh embodiment differs from the sixth embodiment in that buffers are added to the control signal lines. FIG. 28 is a schematic diagram depicting a configuration of a semiconductor device according to the seventh embodiment in plan view. In FIG. 28, the portion corresponding to the first power domain 31A is omitted. FIG. 28 in particular depicts portions concerning the arrangement of control signal lines, and omits some vias and the like.

In the seventh embodiment, buffers 5700 are added to the control signal lines 5110 and 5610, as depicted in FIG. 28. For example, the buffers 5700 are provided in the first chip 10. For example, the buffers 5700 are supplied the potentials from the VDD interconnections and the VSS interconnections, similar to the buffers 60. The buffers 5700 may be provided in the first power domain 31A, similar to the buffers 60. The other configurations are the same as or similar to those of the sixth embodiment.

The buffers 5700 can function as delay circuits. Therefore, delays in transmissions of control signals by the buffers 5700 can be used to control timings of operations of the switch transistors 51.

Eighth Embodiment

Figure 29:
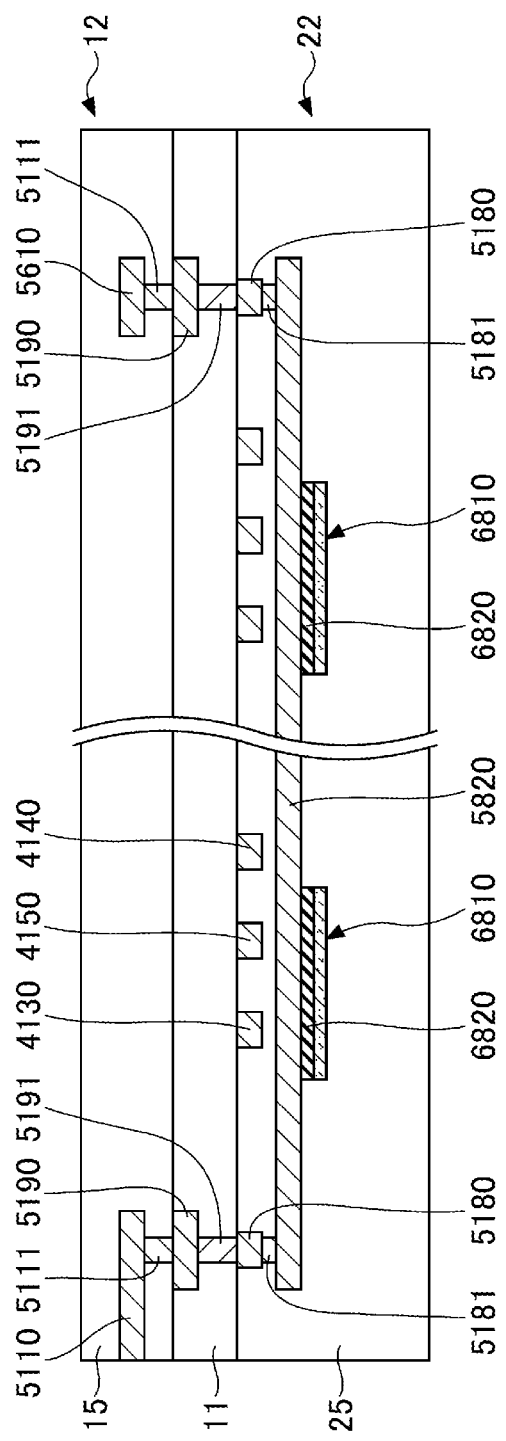
FIG. 29 is a cross-sectional diagram depicting a semiconductor device according to an eighth embodiment.

Next, an eighth embodiment will be described. The eighth embodiment differs from the sixth embodiment, etc., in that the control signal lines function as gate electrodes. FIG. 29 is a cross-sectional diagram depicting a semiconductor device according to the eighth embodiment. In FIG. 29, in particular, portions concerning control signal lines and switch transistors are depicted, and some power lines and the like are omitted.

In the eighth embodiment, the control signal lines 5670 are replaced by gate electrodes 5820 extending the X-direction, as depicted in FIG. 29. A plurality of gate insulating films 6820 in contact with the gate electrodes 5820 and a plurality of semiconductor layers 6810 in contact with the plurality of gate insulating films 6820, respectively, are provided.

The other configurations are the same as or similar to those of the sixth embodiment.

In the eighth embodiment, due to the semiconductor layers 6810, great parasitic capacitances are provided to the gate electrodes 5820. Therefore, the effect of suppressing the steep rise of the potential can be further increased.

Ninth Embodiment

Figure 30:
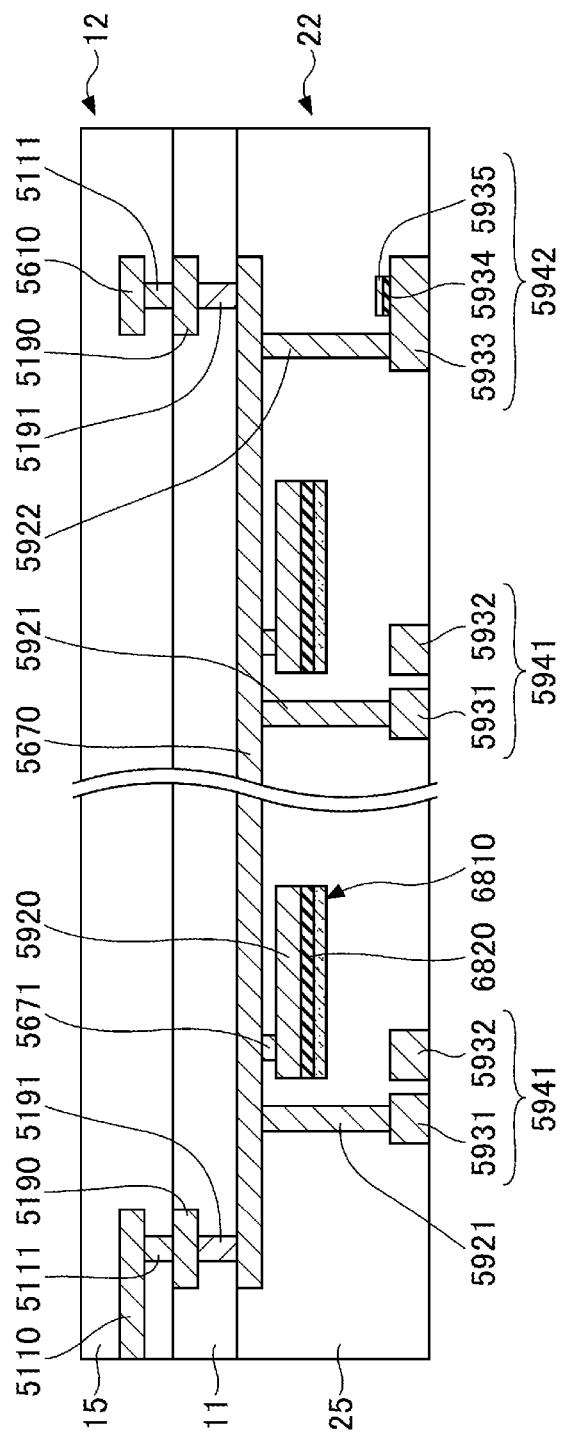
FIG. 30 is a cross-sectional diagram depicting a semiconductor device according to a ninth embodiment.

Next, a ninth embodiment will be described. The ninth embodiment differs from the sixth embodiment, etc., in that configurations that increase the parasitic capacitances of the control signal lines are added. FIG. 30 is a cross-sectional diagram depicting a semiconductor device according to the ninth embodiment. In FIG. 30, in particular, portions concerning control signal lines and switch transistors are depicted, and some power lines and the like are omitted.

In the ninth embodiment, as depicted in FIG. 30, a plurality of gate electrodes 5920 are connected to a control signal line 5670 via vias 5671, respectively, and gate insulating films 6820 and semiconductor layers 6810 are provided beneath the gate electrodes 5920.

Interconnection capacitance sections 5941 having interconnections 5931 and interconnections 5932 arranged next to each other are connected to the control signal line 5670 via vias 5921. For example, the interconnections 5931 and 5932 extend in the Y-direction, and the vias 5921 are connected to the interconnections 5931.

Additionally, an interconnection 5933 extending in the Y-direction is connected to the control signal line 5670 via a via 5922. An insulating film 5934 and a conductive film 5935 are formed on the interconnection 5933. A capacitance element 5942 is formed of the interconnection 5933, the insulating film 5934, and the conductive film 5935.

In the ninth embodiment, due to the interconnection capacitance sections 5941 and the capacitance element 5942, great parasitic capacitances are provided to the control signal line 5670. Therefore, the effect of suppressing the steep rise of the potential can be further enhanced.

Only the interconnection capacitance sections 5941 or the capacitance element 5942 may be provided. Also the other embodiments may include the interconnection capacitance sections 5941, may include the capacitance element 5942, or may include both of the interconnection capacitance sections 5941 and the capacitance element 5942.

Tenth Embodiment

Figure 31:
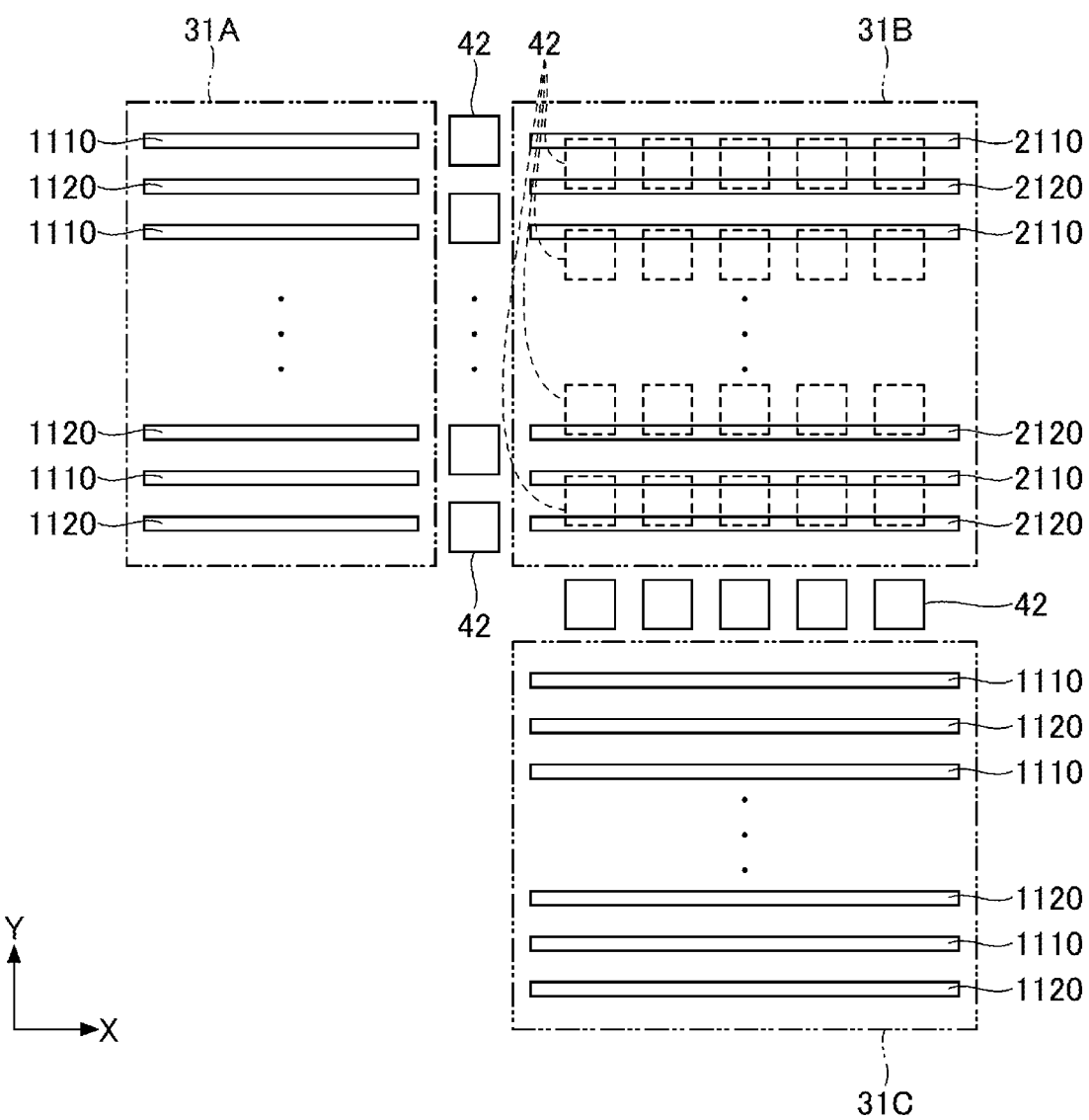
FIG. 31 is a schematic diagram depicting an outline of power domains in a tenth embodiment.
Figure 32:
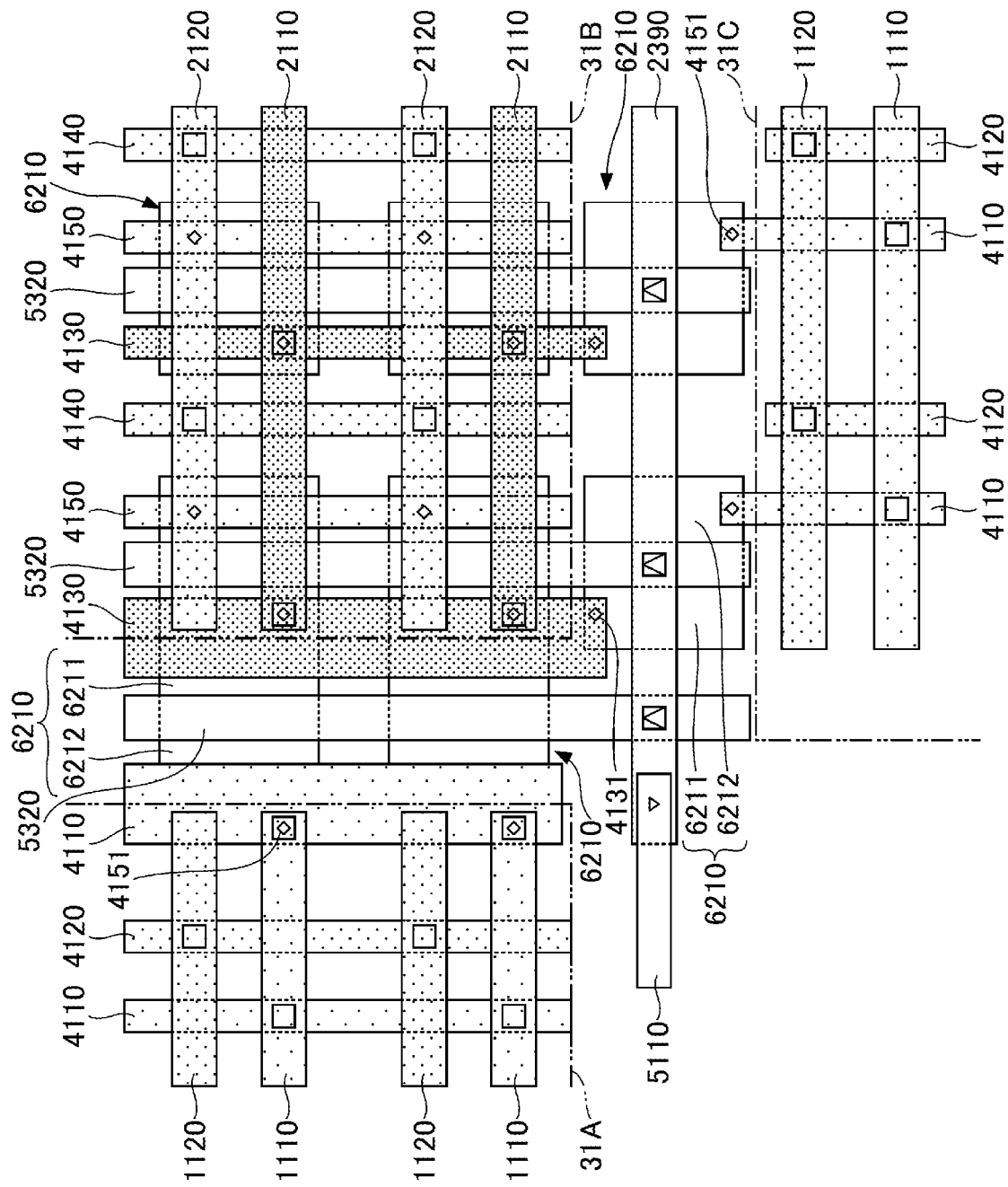
FIG. 32 is a schematic diagram depicting a configuration of the semiconductor device according to the tenth embodiment in plan view.

Next, a tenth embodiment will be described. The tenth embodiment is different from the first embodiment, etc., mainly in the arrangement of the power domains and the arrangement of the power switch circuits. FIG. 31 is a schematic diagram depicting an outline of power domains in the tenth embodiment. FIG. 32 is a schematic diagram depicting a configuration of a semiconductor device according to the tenth embodiment in plan view.

As depicted in FIG. 31, for example, similar to the first embodiment, the second power domain 31B is positioned on the X-direction side of the first power domain 31A. In the present embodiment, a third power domain 31C is provided on a side opposite to the Y-direction side with respect to the second power domain 31B. The third power domain 31C includes circuits connected to the power lines 1110 and 1120, as in the first power domain 31A. The power switch circuits 42 are provided to overlap the second power domain 31B in plan view, similar to the first embodiment. The power switch circuits 42 are provided also between the first and second power domains 31A and 31B and provided also between the third and second power domains 31C and 31B.

The arrangement of the first power domain 31A or the third power domain 31C in plan view is not limited to that of FIG. 31. That is, at least a portion of the third power domain 31C and the second power domain 31B may be arranged along a direction perpendicular to a direction in which the power lines 1110 and the power lines 2110 extend.

Semiconductor layers 6210 are provided also between first and second power domains 31A and 31B, as depicted in FIG. 32. Gate electrodes 5320 extending in the Y-direction are provided also between the first power domain 31A and the second power domain 31B. The power line 4110 nearest to the second power domain 31B from among the power lines 4110 located in the first power domain 31A is connected to the VDD connection sections 6212 of the semiconductor layers 6210 via vias 4151. The power line 4130 nearest to the first power domain 31A from among the power lines 4130 provided in the second power domain 31B is connected to the VVDD connection sections 6211 of the semiconductor layers 6210 via vias 4131.

The third power domain 31C is also provided with the power lines 1110, 1120, 4110, 4120, and the like. Semiconductor layers 6210 are provided also between the third power domain 31C and the second power domain 31B. The power lines 4110 in the third power domain 31C are connected to the VDD connection sections 6212 of the semiconductor layers 6210 between the third power domain 31C and the second power domain 31B via vias 4151. The power lines 4130 are connected via vias 4131 to the VVDD connection sections 6211 of the semiconductor layers 6210 between the third power domain 31C and second power domain 31B.

The other configurations are the same as or similar to those of the third embodiment.

Also in accordance with the tenth embodiment, the same advantageous effects as those of the third embodiment can be obtained.

Also in the other embodiments, the power switch circuits 42 may be provided between the first power domain 31A and the second power domain 31B. Also in the other embodiments, the third power domain 31C may be provided, and the power switch circuits 42 may be provided between the third power domain 31C and the second power domain 31B.

Eleven Embodiment

Figure 33:
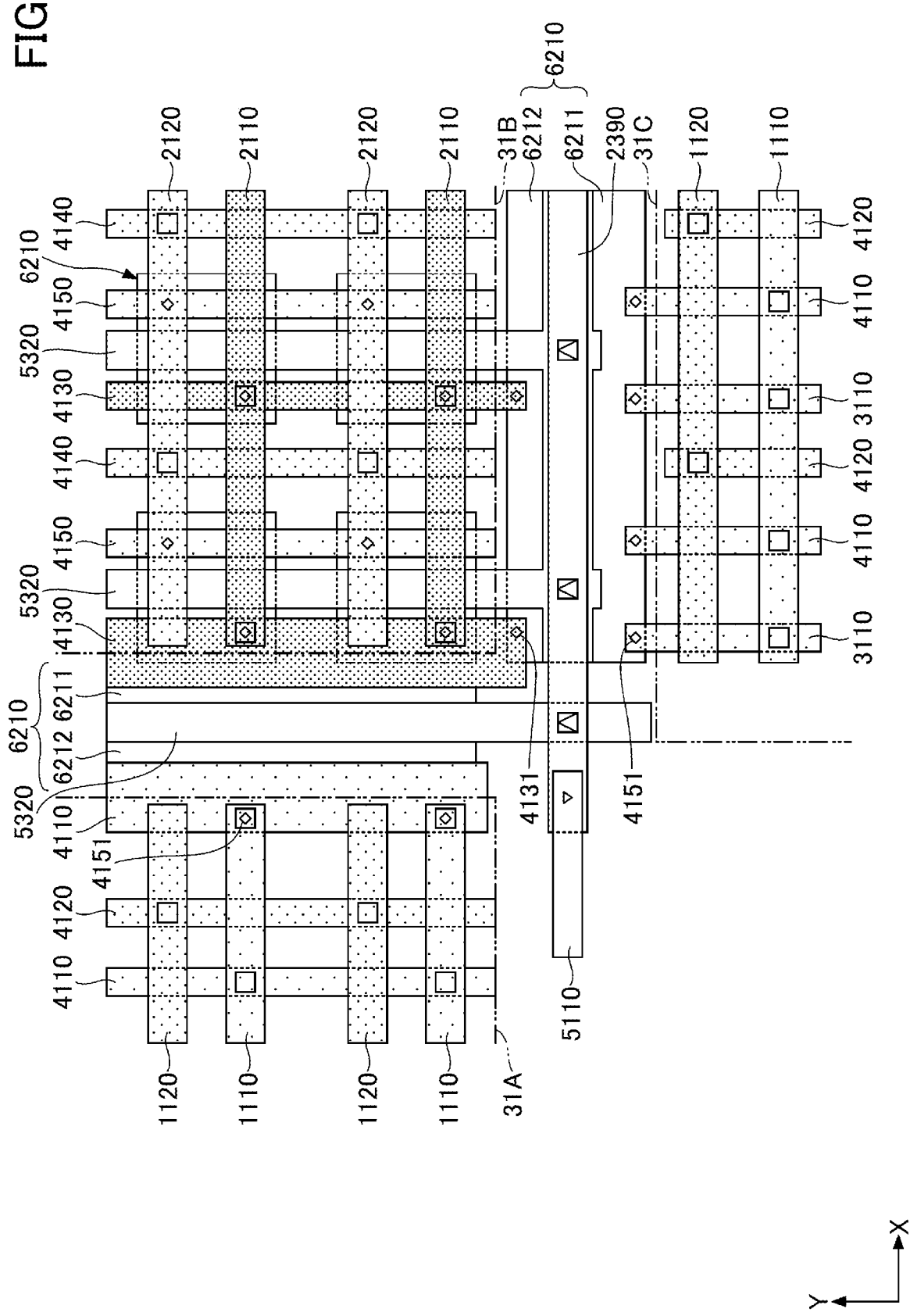
FIG. 33 is a schematic diagram depicting a configuration of a semiconductor device according to an eleventh embodiment in plan view.

Next, an eleventh embodiment will be described. The eleventh embodiment differs from the tenth embodiment mainly in the configuration of the semiconductor layers between the power domains. FIG. 33 is a schematic diagram depicting a configuration of a semiconductor device according to the eleventh embodiment in plan view.

In the eleventh embodiment, the semiconductor layer 6210 between the first power domain 31A and the second power domain 31B extends in the Y-direction, as depicted in FIG. 33. The semiconductor layer 6210 between the third power domain 31C and the second power domain 31B extends in the X-direction.

The other configurations are the same as or similar to those of the tenth embodiment.

In accordance with the eleventh embodiment, the same advantageous effects as those of the tenth embodiment can be obtained.

Twelfth Embodiment

Figure 34:
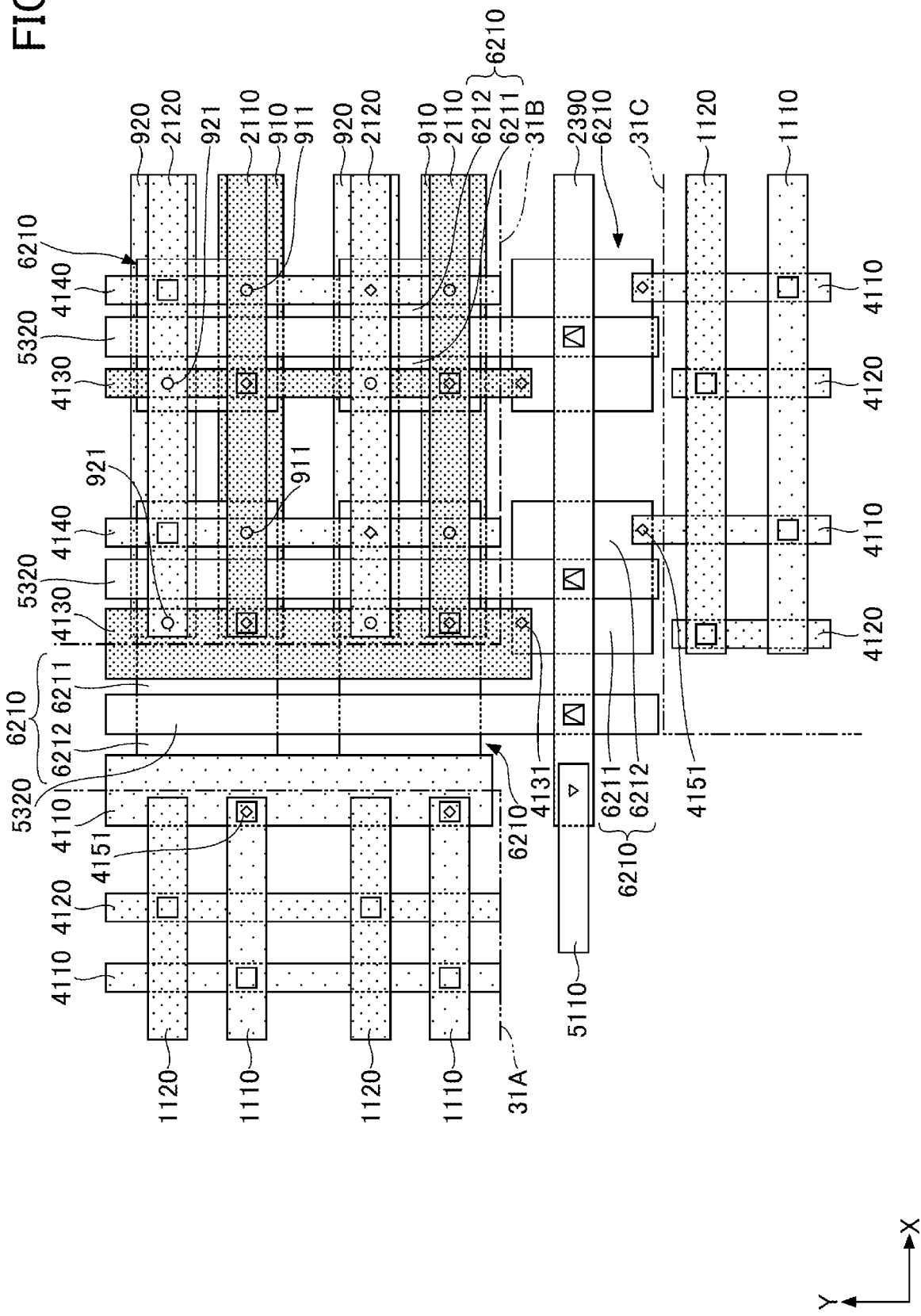
FIG. 34 is a schematic diagram depicting a configuration of a semiconductor device according to a twelfth embodiment in plan view.

Next, a twelfth embodiment will be described. The twelfth embodiment is different from the sixth embodiment, etc., mainly in the relationships between the switch transistors and the VDD interconnections. FIG. 34 is a schematic diagram depicting a configuration of a semiconductor device according to the twelfth embodiment in plan view.

In the twelfth embodiment, as depicted in FIG. 34, power lines 910 and 920 extending in the X-direction are provided below semiconductor layers 6210 in the second power domain 31B. The power lines 910 correspond to VDD interconnections, and the power lines 920 correspond to VVDD interconnections. The power lines 910 are connected to the VDD connection sections 6212 of the semiconductor layers 6210 via vias 911 provided under the semiconductor layers 6210. The power lines 920 are connected to VVDD connection sections 6211 of the semiconductor layers 6210 via vias 912 provided under the semiconductor layers 6210.

In the second power domain 31B, power lines 4130 and 4140 are alternately disposed in a surface layer portion of the insulating layer 25. The power lines 4140 may be provided above the VDD connection sections 6212 arranged side by side in the Y-direction.

The other configurations are the same as or similar to those of the tenth embodiment.

Also in accordance with the twelfth embodiment, the same advantageous effects as those of the tenth embodiment can be obtained. In addition, according to the twelfth embodiment, the number of power lines provided in the surface layer portion of the insulating layer 25 can be reduced compared to the tenth and eleventh embodiments.

Figure 35:
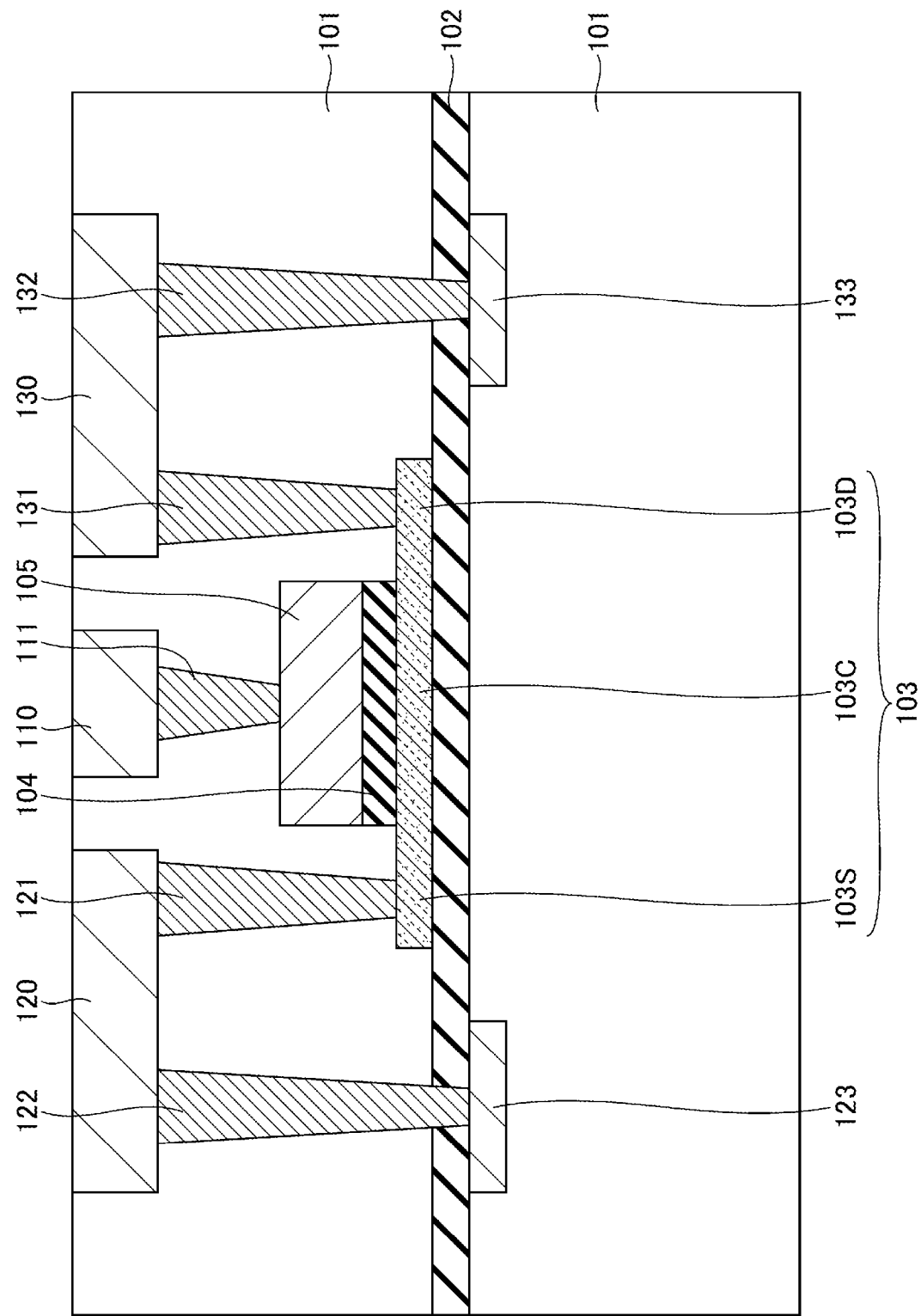
FIG. 35 is a cross-sectional diagram depicting an example of a cross-sectional configuration of a switch transistor.
Figure 36:
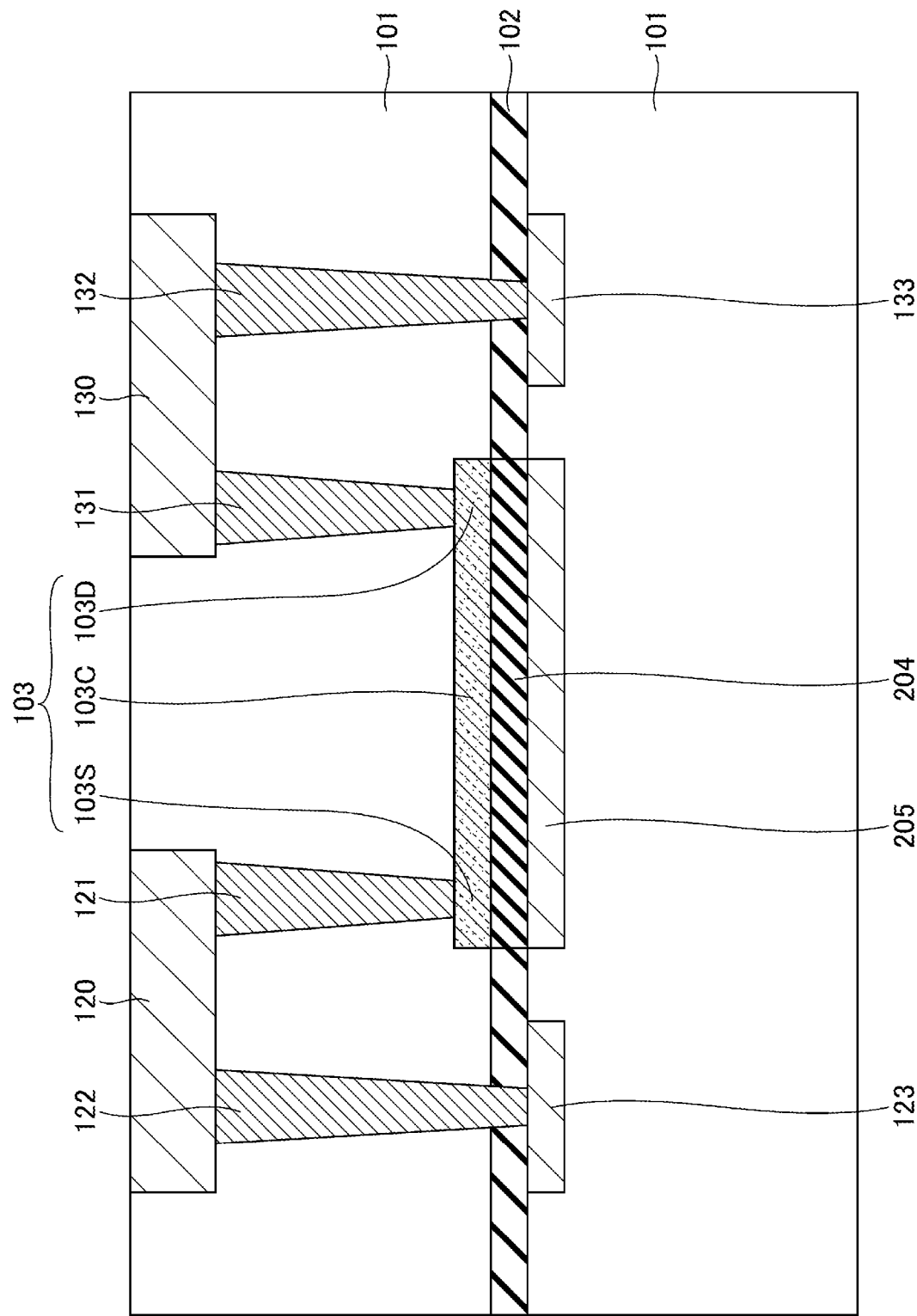
FIG. 36 is a cross-sectional diagram depicting an example of a cross-sectional configuration of the switch transistor.
Figure 37:
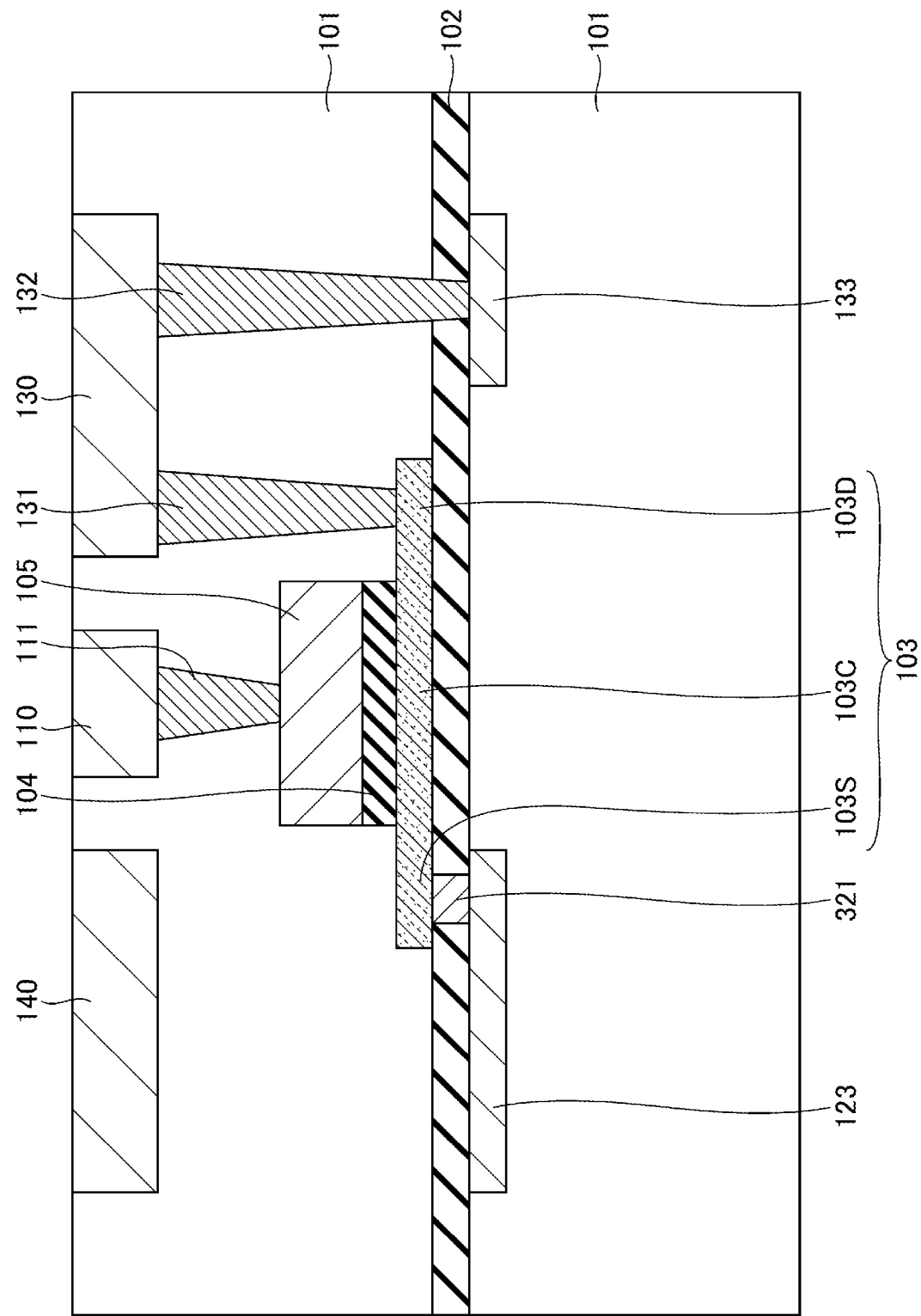
FIG. 37 is a cross-sectional diagram depicting an example of a cross-sectional configuration of the switch transistor.

An outline of a cross-sectional configuration of the switch transistors will now be described. FIGS. 35-37 are cross-sectional diagrams depicting examples of a cross-sectional configuration of the switch transistors.

In a first example depicted in FIG. 35, a base insulating film 102 is provided in an insulating layer 101, and a semiconductor layer 103, a gate insulating film 104, and a gate electrode 105 are provided on the base insulating film 102. A control signal line 110, a power line 120 corresponding to a VDD interconnection, and a power line 130 corresponding to the VVDD interconnection are provided in a surface layer portion of the insulating layer 101. The semiconductor layer 103 includes a channel 103C, and a source 103S and a drain 103D which sandwich the channel 103C. The power line 120 and the source 103S are connected via a via 121, and the power line 130 and the drain 103D are connected via a via 131. A power line 123 corresponding to a VDD interconnection and a power line 133 corresponding to a VVDD interconnection are provided beneath the base insulating film 102. The power line 120 and the power line 123 are connected via a via 122, and the power line 130 and the power line 133 are connected via a via 132. The control signal line 110 is connected to the gate electrode 105 via a via 111.

In a second example depicted in FIG. 36, a base insulating film 102 includes a gate insulating film 204, a semiconductor layer 103 is provided above the gate insulating film 204, and a gate electrode 205 is provided below the gate insulating film 204. The other configurations are the same as or similar to those of the first example.

In a third example depicted in FIG. 37, a power line 123 provided beneath a base insulating film 102 is connected to a source 103S via a via 321 penetrating the base insulating film 102. A power line 140 corresponding to a VSS interconnection may be provided in a surface layer portion of the insulating layer 101 above the power line 123. The other configurations are the same as or similar to those of the first example.

A material of the base insulating film may be, for example, silicon oxide, silicon nitride, silicon carbide, silicon oxide nitride, silicon oxide carbide, or the like. A material of the semiconductor layer is, for example, InGaZnO (IGZO), ZnO, ZnSnO, InZnO, or the like. A material of the gate insulating film may be, for example, $SiO_2$, SiOxNy, SiN, $Al_2O_3$, or the like. A material of the gate electrode may be, for example, molybdenum, titanium, chromium, tantalum, magnesium, silver, tungsten, aluminum, copper, neodymium, ruthenium, scandium, or the like. A material of the gate electrode may be graphene, or the like.

The switch transistors 51 used in each of the above-described embodiments are classified into the first to third examples in terms of the lamination relationships between the gate electrodes and the semiconductor layers and the connection relationships between the semiconductor layers and the VDD interconnections, as follows. That is, the switch transistors 51 used in the first to fourth, and sixth to eleventh embodiments are classified as the first examples. The switch transistors 51 used in the fifth embodiment are classified as the second examples. The switch transistors 51 used in the twelfth embodiment are classified as the third examples.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a depicting of the superiority and inferiority of the invention. Although the semiconductor devices have been described with reference to the embodiments, it should be understood that the invention is not limited to these embodiments, and the various changes, substitutions, and alterations could be made hereto without departing from the spirit and scope of the invention.

What is claimed is:

1. A semiconductor device, comprising:
    a first chip including a substrate and a first interconnection layer formed on a first surface of the substrate; and
    a second interconnection layer formed on a second surface opposite to the first surface of the substrate,
    wherein
    the second interconnection layer includes
        a first power line to which a first power potential is applied,
        a second power line to which a second power potential is applied, and
        a first switch connected between the first power line and the second power line,
    the first chip includes
        a first grounding line,
        a third power line to which the second power potential is applied, and
        a first region in which the first grounding line and the third power line are disposed, and
    in plan view, the first switch overlaps the first region.

2. The semiconductor device as claimed in claim 1, comprising
    a first via formed in the substrate to connect the second power line to the third power line.

3. The semiconductor device as claimed in claim 2, wherein
    the first via overlaps the first region in plan view.

4. The semiconductor device as claimed in claim 1, wherein
    the first chip includes a second grounding line,
a fourth power line connected to the first power line, and
a second region in which the second grounding line and the fourth power line are disposed.

5. The semiconductor device as claimed in claim 4, wherein
the second region includes a control circuit that is connected between the second grounding line and the fourth power line and is configured to control the first switch.

6. The semiconductor device as claimed in claim 5, wherein
the first chip includes a first control signal line configured to transmit an output signal of the control circuit, and
the semiconductor device includes a first connection region that is outside of the second region in plan view and connects the first control signal line and a control terminal of the first switch.

7. The semiconductor device as claimed in claim 6, wherein
the first connection region is provided between the first region and the second region in plan view.

8. The semiconductor device as claimed in claim 6, wherein
control terminals of a plurality of first switches, including the first switch, connected between the first power line and the second power line, are connected to each other.

9. The semiconductor device as claimed in claim 4, wherein
the second interconnection layer includes
a fifth power line to which the first power potential is applied,
a sixth power line to which the second power potential is applied, and
a second switch connected between the fifth power line and the sixth power line,
wherein
in plan view, the second switch is disposed between the first region and the second region.

10. The semiconductor device as claimed in claim 1, wherein
the first switch includes
a semiconductor layer connected to the first power line and the second power line,
a gate electrode, and
a gate insulating film provided between the semiconductor layer and the gate electrode.

11. The semiconductor device as claimed in claim 10, wherein
the gate insulating film is formed on a surface of the semiconductor layer that faces the first chip, and
the gate electrode is formed on a surface of the gate insulating film that faces the first chip.

12. The semiconductor device as claimed in claim 11, wherein
the first power line is connected to a surface of the semiconductor layer opposite to the surface of the semiconductor layer that faces the first chip.

13. The semiconductor device as claimed in claim 10, wherein
the gate insulating film is formed on a surface of the semiconductor layer opposite to a surface of the semiconductor layer that faces the first chip, and
the gate electrode is formed on a surface of the gate insulating film opposite to a surface of the gate insulating film that faces the first chip.

14. The semiconductor device as claimed in claim 1, comprising
a plurality of the first switches that are connected in parallel.

15. The semiconductor device as claimed in claim 14, wherein
the plurality of first switches are arranged in a grid-like manner in plan view in a first direction and a second direction perpendicular to the first direction,
the plurality of first switches are grouped into switch groups, first switches included in a switch group of the switch groups being arranged in the first direction and being connected in parallel, and
the switch groups arranged next to each other in the second direction are connected to each other outside the first region in plan view.

16. The semiconductor device as claimed in claim 15, wherein
control terminals of the switch groups are connected together via buffers outside the first region.

17. The semiconductor device as claimed in claim 15, comprising
capacitance elements connected to control terminals of the switch groups.

* * * * *